(12) United States Patent
Tomiyasu et al.

(10) Patent No.: US 8,092,604 B2
(45) Date of Patent: Jan. 10, 2012

(54) SOLID ORGANOMETALLIC COMPOUND-FILLED CONTAINER AND FILLING METHOD THEREOF

(75) Inventors: Shizuo Tomiyasu, Shunan (JP); Kohichi Tokudome, Shunan (JP); Kenichi Haga, Shunan (JP)

(73) Assignee: Tosoh Finechem Corporation, Yamaguchi (JP)

( * ) Notice: Subject to any disclaimer, the term of this patent is extended or adjusted under 35 U.S.C. 154(b) by 64 days.

(21) Appl. No.: 12/464,333

(22) Filed: May 12, 2009

(65) Prior Publication Data

US 2009/0283041 A1 Nov. 19, 2009

Related U.S. Application Data

(62) Division of application No. 10/865,880, filed on Jun. 14, 2004, now Pat. No. 7,547,363.

(30) Foreign Application Priority Data

Jul. 8, 2003 (JP) ................................ 2003-271742
Jul. 11, 2003 (JP) ................................ 2003-273784

(51) Int. Cl.
*C23C 16/00* (2006.01)
*C23C 16/448* (2006.01)
*C23C 16/18* (2006.01)

(52) U.S. Cl. ........................................ 118/726; 118/715
(58) Field of Classification Search .................. 118/715, 118/723 VE, 726; 261/123
See application file for complete search history.

(56) References Cited

U.S. PATENT DOCUMENTS

| | | | |
|---|---|---|---|
| 823,382 | A | 6/1906 | Akeson |
| 3,947,549 | A | 3/1976 | Born et al. |
| 5,558,687 | A | 9/1996 | Cain |
| 6,270,839 | B1 | 8/2001 | Onoe et al. |
| 6,444,038 | B1 * | 9/2002 | Rangarajan et al. .......... 118/715 |
| 7,547,363 | B2 * | 6/2009 | Tomiyasu et al. ............. 118/726 |
| 7,722,720 | B2 * | 5/2010 | Shenai-Khatkhate et al. ............................. 118/726 |
| 2002/0040729 | A1 | 4/2002 | Takeda et al. |
| 2002/0092575 | A1 | 7/2002 | Takeda et al. |
| 2003/0075925 | A1 | 4/2003 | Lindfors et al. |
| 2004/0013577 | A1 | 1/2004 | Ganguli et al. |
| 2005/0008799 | A1 | 1/2005 | Tomiyasu et al. |
| 2005/0072357 | A1 | 4/2005 | Shero et al. |
| 2005/0263075 | A1 | 12/2005 | Wang et al. |
| 2006/0048711 | A1 | 3/2006 | Vaartstra |
| 2007/0175397 | A1 | 8/2007 | Tomiyasu et al. |
| 2007/0221127 | A1 | 9/2007 | Tran et al. |
| 2009/0136668 | A1 * | 5/2009 | Gregg et al. ............. 427/255.28 |
| 2009/0283041 | A1 * | 11/2009 | Tomiyasu et al. ............. 118/726 |

FOREIGN PATENT DOCUMENTS

| | | |
|---|---|---|
| GB | 2 223 509 A | 4/1990 |
| JP | 2003-303772 | 10/2003 |

* cited by examiner

*Primary Examiner* — Jeffrie R Lund
(74) *Attorney, Agent, or Firm* — Wenderoth, Lind & Ponack, L.L.P.

(57) ABSTRACT

A solid organometallic compound novel filled container stably supplies an apparatus for vapor phase epitaxial growth such as an MOCVD apparatus with a solid organometallic compound over a long term. The solid organometallic compound-filled container has a carrier gas inlet and a carrier gas outlet. The interior of the filled container is separated into a plurality of vertical compartments. A carrier gas introduced via the carrier gas inlet flows through each of the vertical compartments and is then discharged via the carrier gas outlet.

4 Claims, 36 Drawing Sheets

(A)        (C)

(B)

(A)

(B)

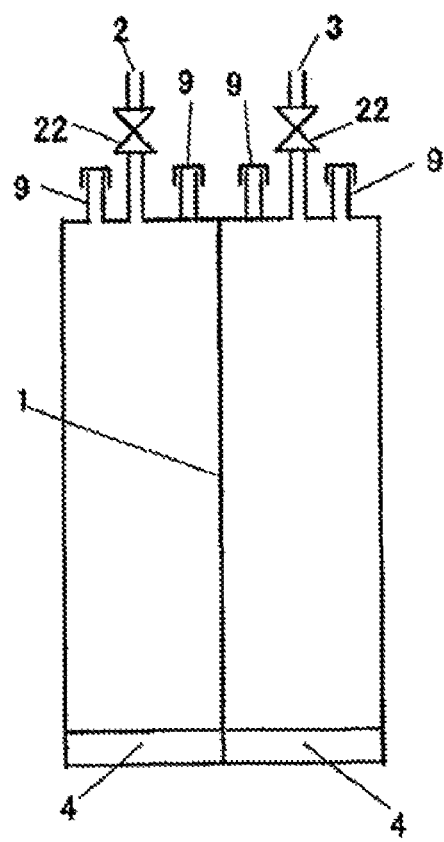
(A)
FIG.3
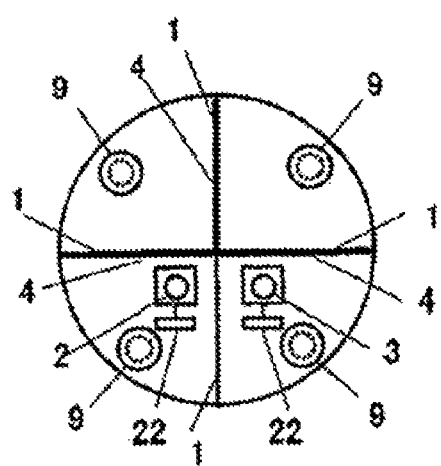
(B)

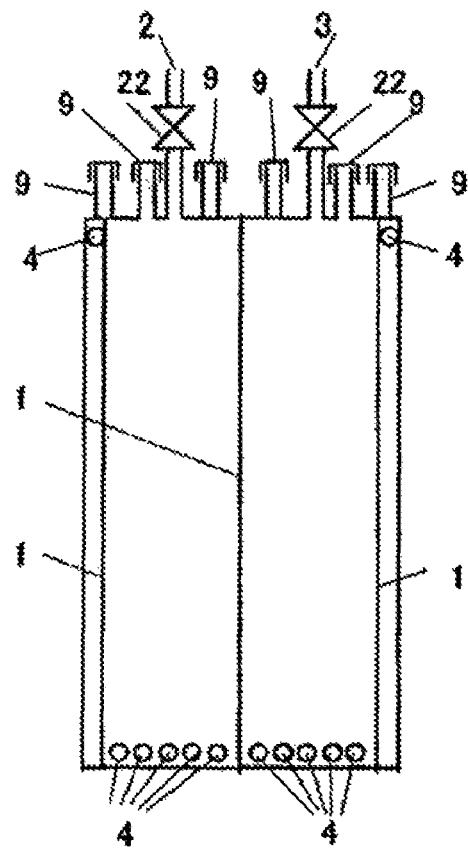
(A)
FIG.4
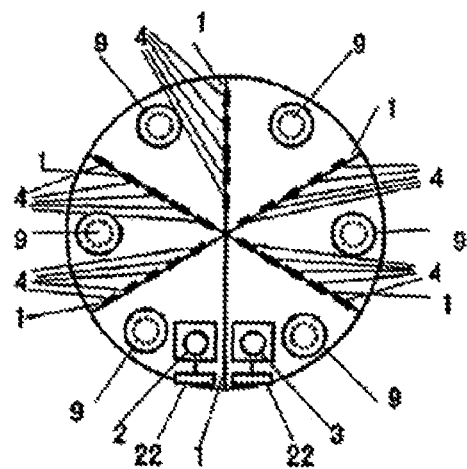
(B)

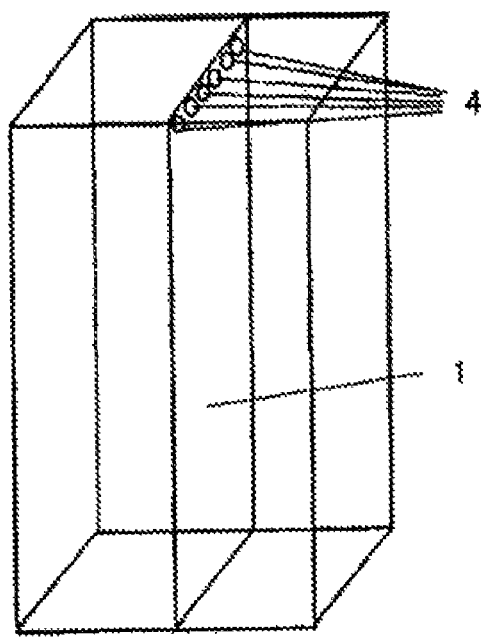
(A)
FIG.5
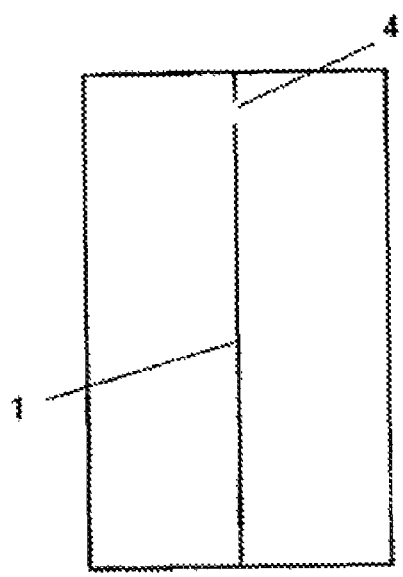
(B)

(A)

(B)

(A)

(B)

(A)

(B)

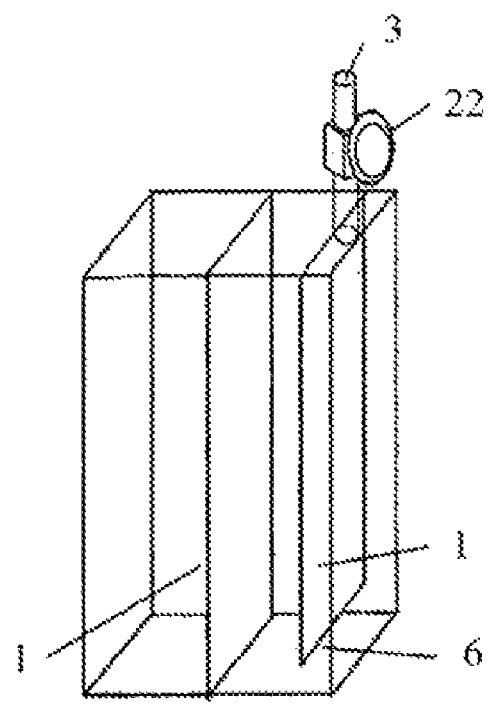
(A)
FIG.11
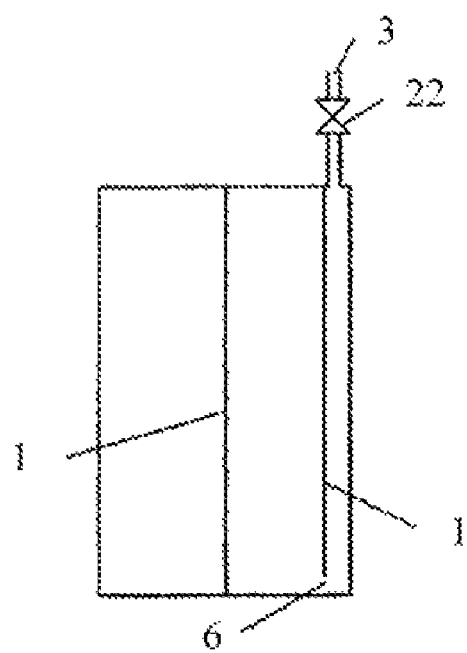
(B)

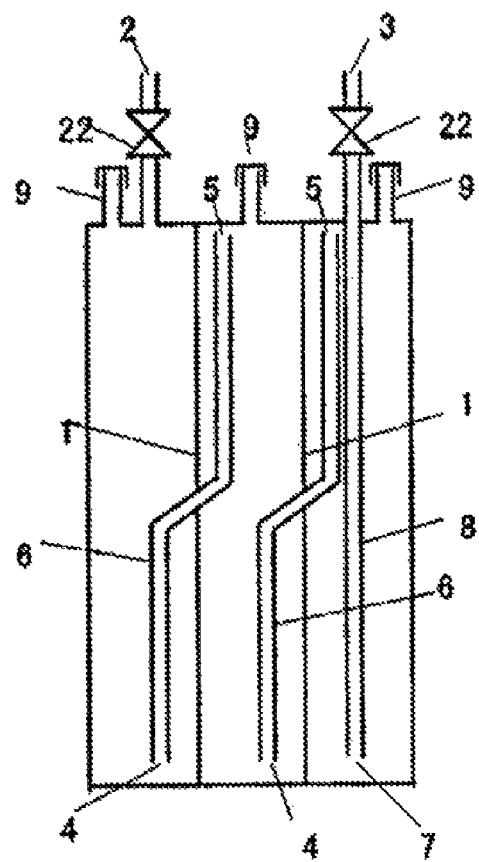
(A)
FIG.14
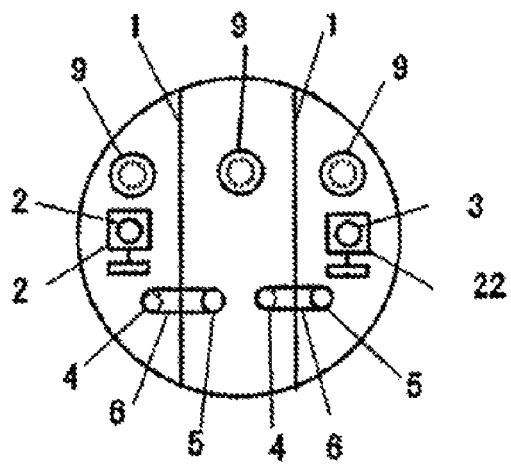
(B)

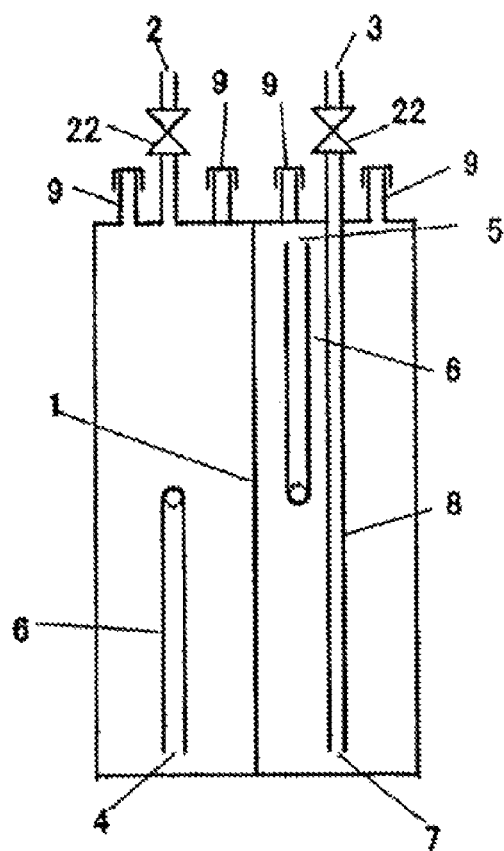
(A)
FIG.15
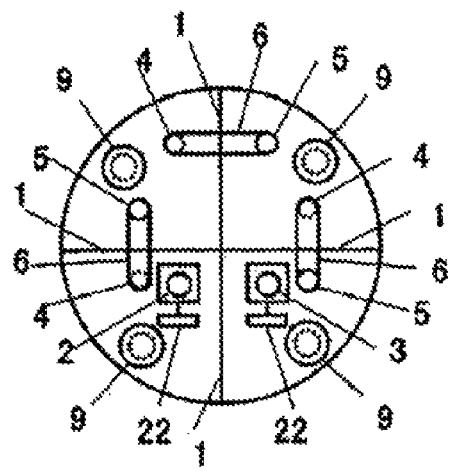
(B)

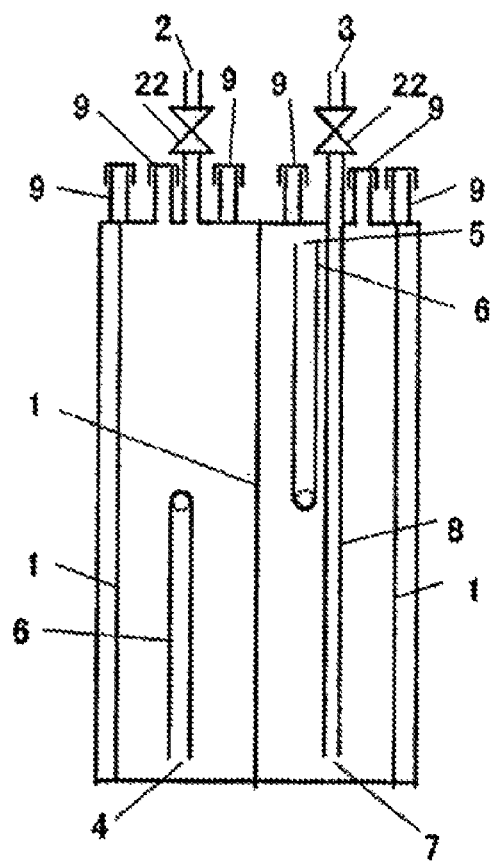
(A)
FIG.16
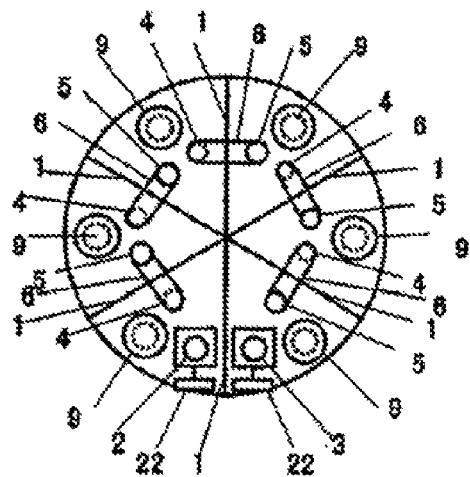
(B)

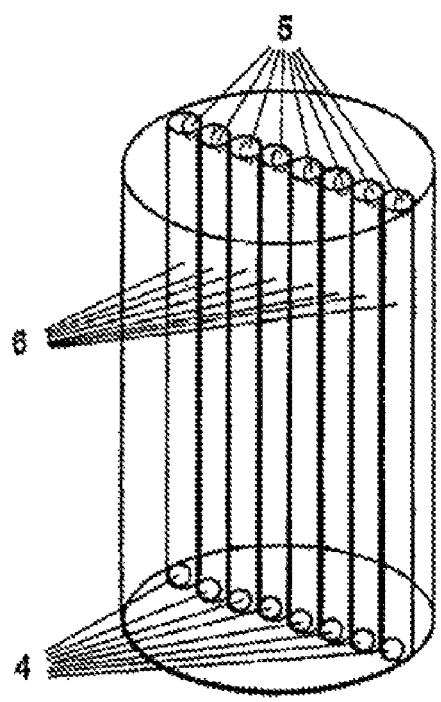
(A)
FIG.21
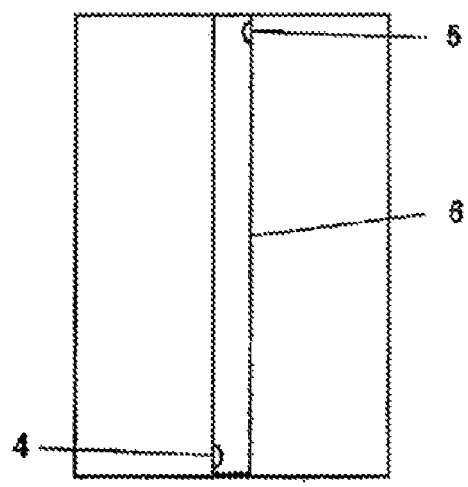
(B)

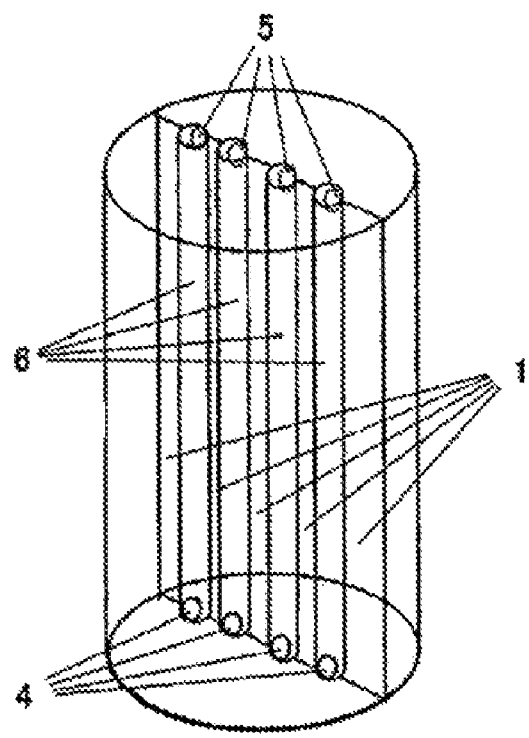
(A)
FIG.22
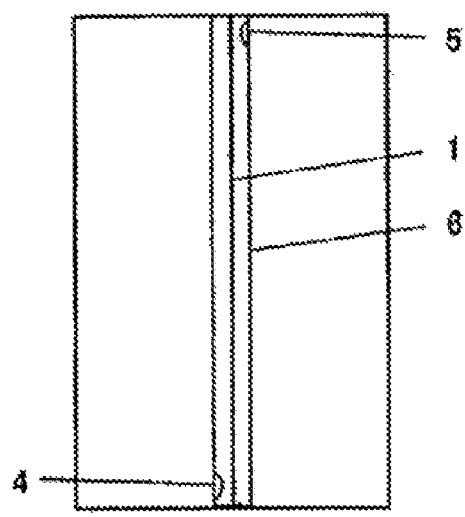
(B)

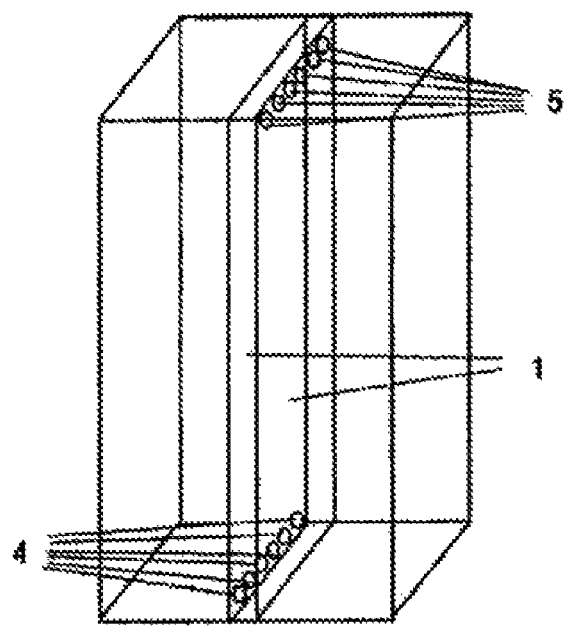
(A)
FIG.23
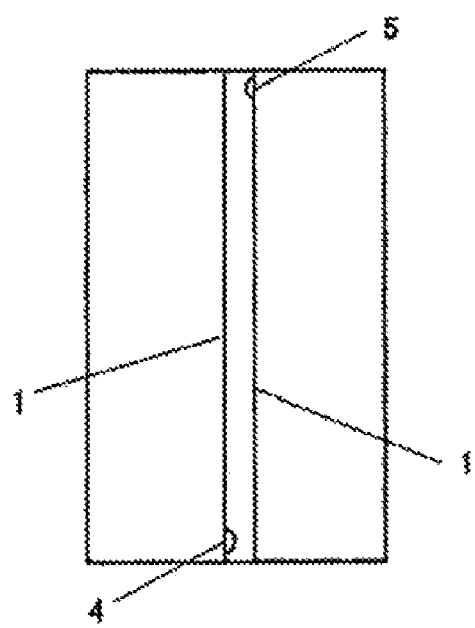
(B)

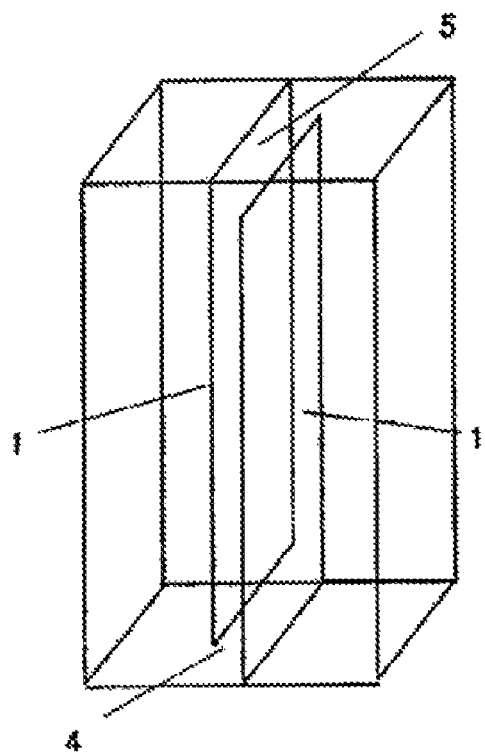
(A)
FIG.24
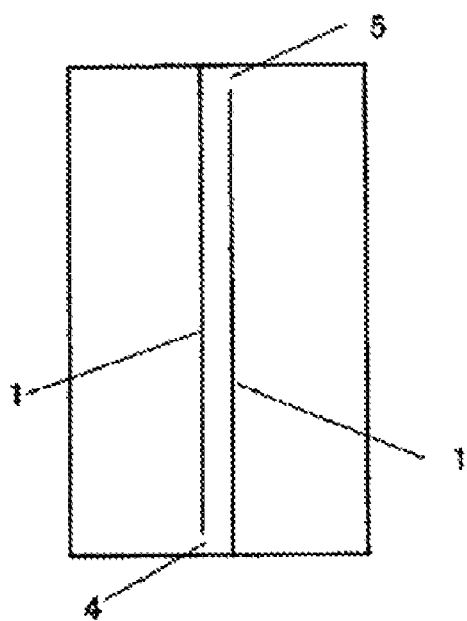
(B)

(A)

(B)

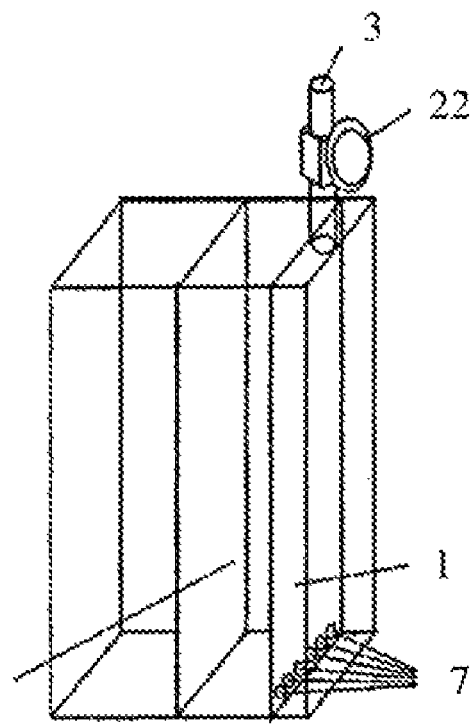
(A)
FIG.26
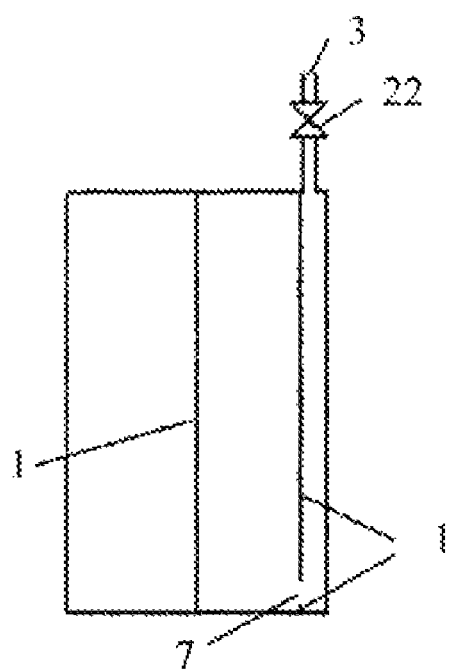
(B)

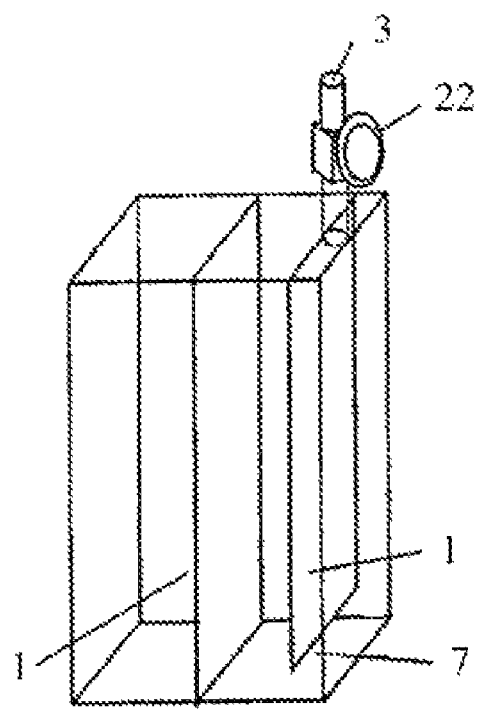
FIG.27
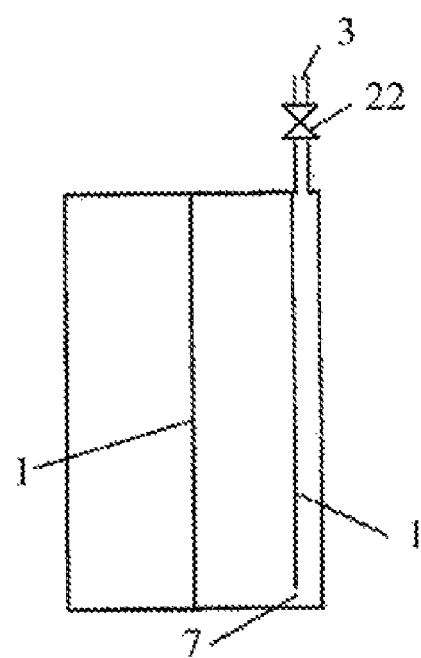
(B)

SOLID ORGANOMETALLIC COMPOUND-FILLED CONTAINER AND FILLING METHOD THEREOF

This application is a divisional of U.S. application Ser. No. 10/865,880, filed Jun. 14, 2004 now U.S. Pat. No. 7,547,363.

BACKGROUND OF THE INVENTION

1. Field of the Invention

The present invention relates to a solid organometallic compound-filled container and a filling method thereof. More specifically, the present invention relates to a solid organometallic compound-filled container and a filling method thereof capable of stably supplying an apparatus for vapor phase epitaxial growth with a constant concentration of a solid organometallic compound over a long term. This solid organometallic compound is a material for use in a vapor phase epitaxial growth technique based on Metalorganic Chemical Vapor Deposition (hereinafter, abbreviated as "MOCVD") method or the like which is used in the manufacture of electronics materials such as compound semiconductors.

2. Description of the Related Art

Organometallic compounds have broad use as materials in manufacture of electronics materials.

In the manufacture of electronics material using organometallic compounds, vapor phase epitaxial growth based on the MOCVD method or the like has often been used in recent years. For example, a thin film of compound semiconductor is manufactured by the MOCVD method using an organometallic compound such as trimethylaluminum, trimethylgallium, and trimethylindium as a material.

When such an organometallic compound is used in the MOCVD method and the organometallic compound is solid in the condition of the MOCVD method, usually, a filled container A having a carrier gas inlet ($2a$) and a carrier gas outlet ($3a$) as shown in FIG. 34 is filled with the organometallic compound, a carrier gas such as hydrogen gas is introduced into the container via the carrier gas inlet ($2a$), and the organometallic compound is drawn out as a gas in which the organometallic compound is saturated in the carrier gas via the carrier gas outlet ($3a$) to be supplied to the MOCVD apparatus.

When the organometallic compound is solid at the temperature that is used in the supplying step, a flow channel is formed in the filled container A where the carrier gas passes through without sufficiently contacting with the solid organometallic compound, making it difficult to keep the carrier gas and the solid organometallic compound in contact with each other in a uniform condition. Therefore, it is difficult to stably supply the MOCVD apparatus with the solid organometallic compound from the filled container A at a constant concentration over a long term. When the solid organometallic compound is supplied according to the aforementioned method using the carrier gas, the ratio of the amount of solid organometallic compound that can be stably supplied to the MOCVD apparatus relative to the filling amount of solid organometallic compound decreases, as the amount of solid organometallic compound to fill the filled container A increases, so that the amount of the solid organometallic compound remaining in the filled container increases, and effective use of the solid organometallic compound is disabled.

For solving these problems, various proposals have been made concerning the method of filling the filled container A with the solid organometallic compound. For example, a method of filling a filled container with a solid organometallic compound together with a filling material is proposed in Japanese Patent Publication No. Hei 5-39915, Japanese Patent Publication No. Hei 6-20051, Japanese Patent Laid-Open Publication No. Hei 7-58023, Japanese Patent Laid-Open Publication No. Hei 8-250440, Japanese Patent Laid-Open Publication No. Hei 8-299778, and the like. For example, a method of filling a filled container A with an inert carrier covered with a solid organometallic compound is proposed in Published Japanese Patent No. 2651530 and the like.

In addition to these proposals, various proposals concerning structure of a filled container itself to be filled with a solid organometallic compound have been made to solve the above-mentioned problems. For example, a filled container B having a diffuser ($20a$) for uniformizing gas disposed at the carrier gas inlet as shown in FIG. 35 to allow the carrier gas to uniformly flow with respect to the solid organometallic compound is proposed in Japanese Patent Publication No. Hei 2-124796 and the like.

Furthermore, a filled container C having a solid organometallic compound chamber ($21a$) having air permeability as shown in FIG. 36 is proposed, for example, in Japanese Patent Laid-Open Publication No. Hei 10-223540 and the like.

Furthermore, a filled container (hereinafter referred to as filled container D) in which a porous inlet chamber as shown in FIG. 37 serves as a filled region for solid organometallic compound is proposed, for example, in Japanese Patent Laid-Open Publication No. 2002-83777 and the like.

As shown in FIG. 34, the conventional filled container A has a carrier gas inlet ($2a$) and a carrier gas outlet ($3a$) in a single container, and has a flow channel ($8a$) implemented by a dip tube with a lower opening ($7a$) which extends from the lower part of the carrier gas outlet to the bottom of the filled container A within the filled container. The present inventor carried out examination to find that when the filled container A having the structure as shown in FIG. 34 was used, in supplying a solid organometallic compound to the MOCVD apparatus using the carrier gas, the longer the supply period of the organometallic compound by the carrier gas, the more the supply amount of the organometallic compound in the carrier gas decreased in a gradual manner. In particular, the effect of stably supplying the solid organometallic compound was significantly impaired when the filling amount of the solid organometallic compound was increased, or the flow rate of the carrier gas was increased. Therefore, the filled container A does not achieve sufficient effect to stably supply the MOCVD apparatus with the solid organometallic compound over a long term.

Also, various filled containers that have been proposed other than that shown in FIG. 34 have a problem in that they are still not satisfactory in stably supplying the MOCVD apparatus with the solid organometallic compound over a long term in the method using carrier gas, or that the outer size of the filled container is significantly large.

As described above, the conventional filled containers for solid organometallic compound are faced with various problems, and there is a need for improving the supply stability of the solid organometallic compound and preventing the filled container from having a significantly large outer size.

SUMMARY OF THE INVENTION

The present invention solves the above-mentioned problems, and relates to a novel filled container capable of stably supplying an apparatus for vapor phase epitaxial growth such as an MOCVD apparatus with a solid organometallic compound at a constant concentration over a long term, and a method of filling the filled container with the solid organometallic compound.

For solving the aforementioned problems, the inventors carried out studies and found that by adopting a novel structure having the features as recited below to the internal structure of the filled container, it is possible to stably supply an apparatus for vapor phase epitaxial growth such as an MOCVD apparatus with a solid organometallic compound at a constant concentration over a long term without significantly increasing the outer size compared to the conventionally known filled containers and to increase the period during which the solid organometallic compound is stably supplied.

More specifically, the present invention provides a solid organometallic compound-filled container having a carrier gas inlet and a carrier gas outlet, wherein an interior of the filled container is separated into a plurality of vertical compartments, and a carrier gas introduced via the carrier gas inlet flows through each of the vertical compartments and is then discharged via the carrier gas outlet.

More specifically, the present invention provides a solid organometallic compound-filled container meeting the following requirements (a) to (c).

In a solid organometallic compound-filled container, (a) an interior of the filled container is separated by at least one partition in a vertical direction, whereby the interior of the filled container is separated into at least two compartments;

(b) the compartments formed in the filled container by separating the interior with the partition includes a compartment having a carrier gas inlet and a compartment having a carrier gas outlet; and (c) the partition inside the filled container includes a partition having an opening that allows the carrier gas to flow from the carrier gas inlet through each of the compartments inside the filled container to the carrier gas outlet.

According to a method of filling a solid organometallic compound-filled container of the present invention with a solid organometallic compound, in the aforementioned solid organometallic compound-filled container meeting the requirements (a) to (c), when the opening is disposed in a lower part of the partition, the opening is disposed at a point lower than or equal to one third of an internal height of the container from an internal bottom of the filled container. When the opening is disposed in an upper part of the partition, the opening is disposed at more than or equal to two thirds of the internal height of the container from the internal bottom of the filled container.

Furthermore, in the solid organometallic-filled container of the invention meeting the requirements (a) to (c), the filled container has a charging port for filling the solid organometallic compound into the compartment inside the filled container formed by separating the interior by the partition.

The present invention also provides a solid organometallic compound-filled container having a carrier gas inlet and a carrier gas outlet in which the interior of the filled container is separated into a plurality of vertical compartments and the carrier gas introduced via the carrier gas inlet flows through each of the vertical compartments and is then discharged via the carrier gas outlet. The carrier gas introduced via the carrier gas inlet is directed to flow downward through each of the vertical compartments and leave via the carrier gas outlet by carrier gas flow direction inverting means.

More specifically, the present invention provides the solid organometallic compound-filled container so as to meet the following requirements (d) to (h).

In the aforementioned solid organometallic compound-filled container, (d) the interior of the filled container is separated by at least one partition in the vertical direction, whereby the interior of the filled container is separated into at least two compartments;

(e) the compartments formed in the filled container by separating the interior by the partition include a compartment having the carrier gas inlet and a compartment having the carrier gas outlet;

(f) the partition inside the filled container has a communicating channel with a lower opening and an upper opening that allows the carrier gas to flow from the carrier gas inlet through each of the compartments inside the filled container to the carrier gas outlet;

(g) in the communicating channel, the carrier gas introduced into the interior of the filled container is introduced via the lower opening and discharged via the upper opening of the communicating channel; and (h) the filled container has a discharging channel having a lower opening for discharging the carrier gas from the lower part of the compartment having the carrier gas outlet via the carrier gas outlet.

In the solid organometallic-filled container of the present invention meeting the requirements of (d) to (h), in the aforementioned communicating channel, the lower opening of the communicating channel is disposed at less than or equal to one third of the internal height of the container from the internal bottom of the filled container, the upper opening of the communicating channel is disposed at more than or equal to two thirds of the internal height of the container from the internal bottom of the filled container, and in the discharging channel, the lower opening of the discharging channel is disposed at less than or equal to one third of the internal height of the container from the internal bottom of the filled container.

Furthermore, in the solid organometallic-filled container of the invention meeting the requirements (d) to (h), the filled container may have a charging port for filling the compartment formed in the filled container by separating the interior by the partition with the solid organometallic compound.

In the solid organometallic compound-filled container of the present invention, trimethylindium may be used as the solid organometallic compound.

The present invention also provides a solid organometallic compound filling method, wherein the filled container of the present invention is filled with a solid organometallic compound.

According to the present invention, in the solid organometallic compound-filled container, by vertically separating the interior of the filled container with a partition into a plurality of compartments to allow the carrier gas flow through each compartment, it is possible to stably supply an apparatus for vapor epitaxial growth such as an MOCVD apparatus with a solid organometallic compound over a long term without increasing the outer size compared to the conventional filled container.

BRIEF DESCRIPTION OF THE DRAWINGS

FIGS. 1(A), 1(B), and 1(C) are schematic views of one embodiment of a filled container of the present invention, in which FIG. 1(A) is a cross sectional view, FIG. 1(B) is a plan view, and FIG. 1(C) is a perspective view;

FIGS. 2(A) and 2(B) are schematic views of one embodiment of a filled container of the present invention, in which FIG. 2(A) is a cross sectional view and FIG. 2(B) is a plan view;

FIGS. 3(A) and 3(B) are schematic views of one embodiment of a filled container of the present invention, in which FIG. 3(A) is a cross sectional view and FIG. 3(B) is a plan view;

FIGS. 4(A) and 4(B) are schematic views of one embodiment of a filled container of the present invention, in which FIG. 4(A) is a cross sectional view and FIG. 4(B) is a plan view;

FIGS. 5(A) and 5(B) are schematic views of one embodiment of a filled container of the present invention, in which FIG. 5(A) is a perspective view and FIG. 5(B) is a cross sectional view;

FIGS. 6(A) and 6(B) are schematic views of one embodiment of a filled container of the present invention, in which FIG. 6(A) is a perspective view and FIG. 6(B) is a cross sectional view;

FIGS. 7(A), 7(B), and 7(C) are schematic views of one embodiment of a filled container of the present invention, in which FIG. 7(A) is a cross sectional view, FIG. 7(B) is a plan view, and FIG. 7(C) is a perspective view;

FIGS. 8(A), 8(B), and 8(C) are schematic views of one embodiment of a filled container of the present invention, in which FIG. 8(A) is a cross sectional view, FIG. 8(B) is a plan view, and FIG. 8(C) is a perspective view;

FIGS. 9(A) and 9(B) are schematic views of one embodiment of a filled container of the present invention, in which FIG. 9(A) is a perspective view and FIG. 9(B) is a cross sectional view;

FIGS. 10(A) and 10(B) are schematic views of one embodiment of a filled container of the present invention, in which FIG. 10(A) is a perspective view and FIG. 10(B) is a cross sectional view;

FIGS. 11(A) and (B) are schematic views of one embodiment of a filled container of the present invention, in which FIG. 11(A) is a perspective view and FIG. 11(B) is a cross sectional view;

FIGS. 12(A), 12(B), and 12(C) are schematic views of one embodiment of a filled container of the present invention, in which FIG. 12(A) is a cross sectional view, FIG. 12(B) is a plan view, and FIG. 12(C) is a perspective view;

FIGS. 13(A), 13(B), and 13(C) are schematic views of one embodiment of a filled container of the present invention, in which FIG. 13(A) is a cross sectional view, FIG. 13(B) is a plan view, and FIG. 13(C) is a perspective view, FIGS. 14(A) and 14(B) are schematic views of one embodiment of a filled container of the present invention, in which FIG. 14(A) is a cross sectional view and FIG. 14(B) is a plan view;

FIGS. 15(A) and 15(B) are schematic views of one embodiment of a filled container of the present invention, in which FIG. 15(A) is a cross sectional view and FIG. 15(B) is a plan view;

FIGS. 16(A) and 16(B) are schematic views of one embodiment of a filled container of the present invention, in which FIG. 16(A) is a cross sectional view and FIG. 16(B) is a plan view;

FIGS. 21(A) and 21(B) are schematic views of one embodiment of a filled container of the present invention, in which FIG. 21(A) is a perspective view and FIG. 21(B) is a cross sectional view;

FIGS. 22(A) and 22(B) are schematic views of one embodiment of a filled container of the present invention, in which FIG. 22(A) is a perspective view and FIG. 22(B) is a cross sectional view;

FIGS. 23(A) and 23(B) are schematic views of one embodiment of a filled container of the present invention, in which FIG. 23(A) is a perspective view and FIG. 23(B) is a cross sectional view;

FIGS. 24(A) and 24(B) are schematic views of one embodiment of a filled container of the present invention, in which FIG. 24(A) is a perspective view and FIG. 24(B) is a cross sectional view;

FIGS. 25(A) and 25(B) are schematic views of one embodiment of a filled container of the present invention, in which FIG. 25(A) is a perspective view and FIG. 25(B) is a cross sectional view;

FIGS. 26(A) and 26(B) are schematic views of one embodiment of a filled container of the present invention, in which FIG. 26(A) is a perspective view and FIG. 26(B) is a cross sectional view;

FIGS. 27(A) and 27(B) are schematic views of one embodiment of a filled container of the present invention, in which FIG. 27(A) is a perspective view and FIG. 27(B) is a cross sectional view;

FIGS. 28(A), 28(B), and 28(C) are schematic views of a filled container used in Example 1 and Example 2, in which FIG. 28(A) is a cross sectional view, FIG. 28(B) is a plan view, and FIG. 28(C) is a perspective view;

FIGS. 29(A), 29(B), and 29(C) are schematic views of a filled container used in Example 3, in which FIG. 29(A) is a cross sectional view, FIG. 29(B) is a plan view and FIG. 29(C) is a perspective view;

DETAILED DESCRIPTION OF THE PREFERRED EMBODIMENTS

Figure 1:
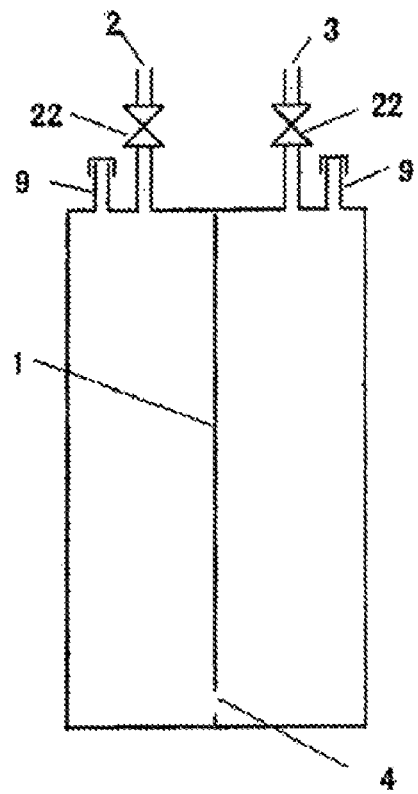
Figure 1:
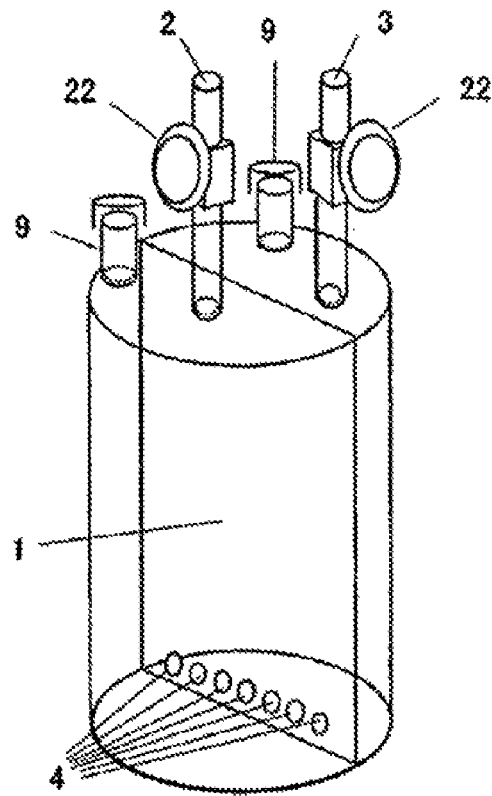
Figure 1:
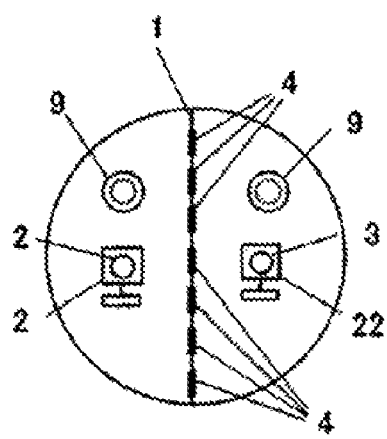
Figure 2:
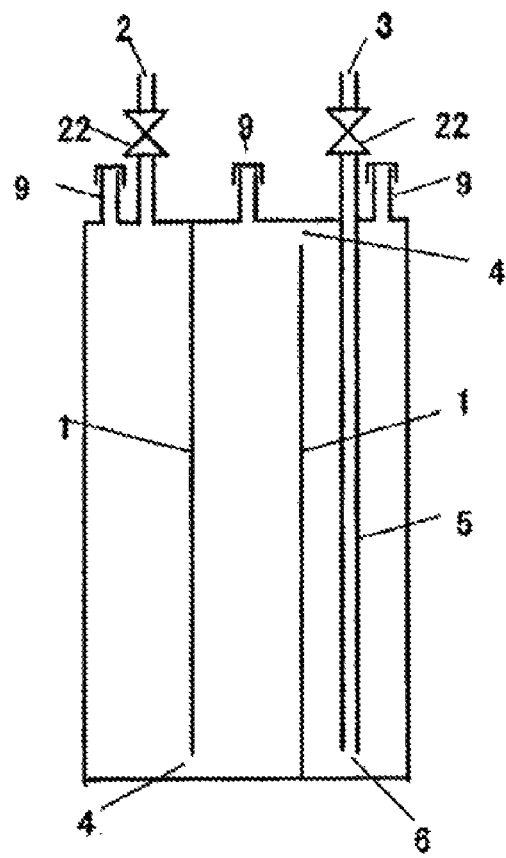
Figure 2:
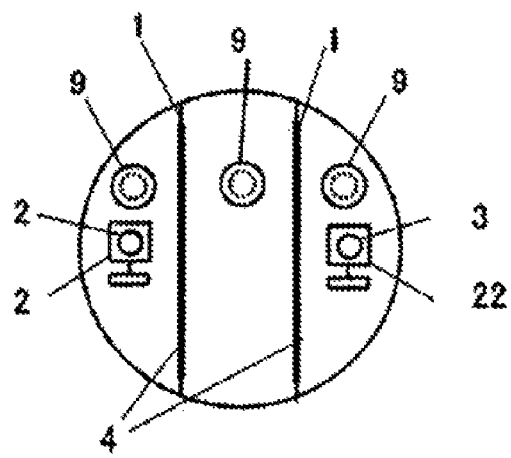
Figure 6:
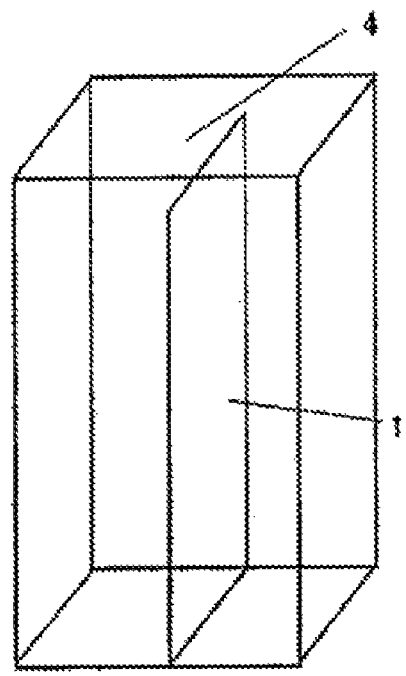
Figure 6:
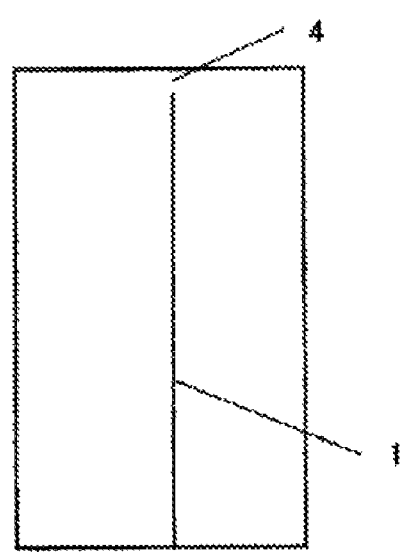
Figure 7:
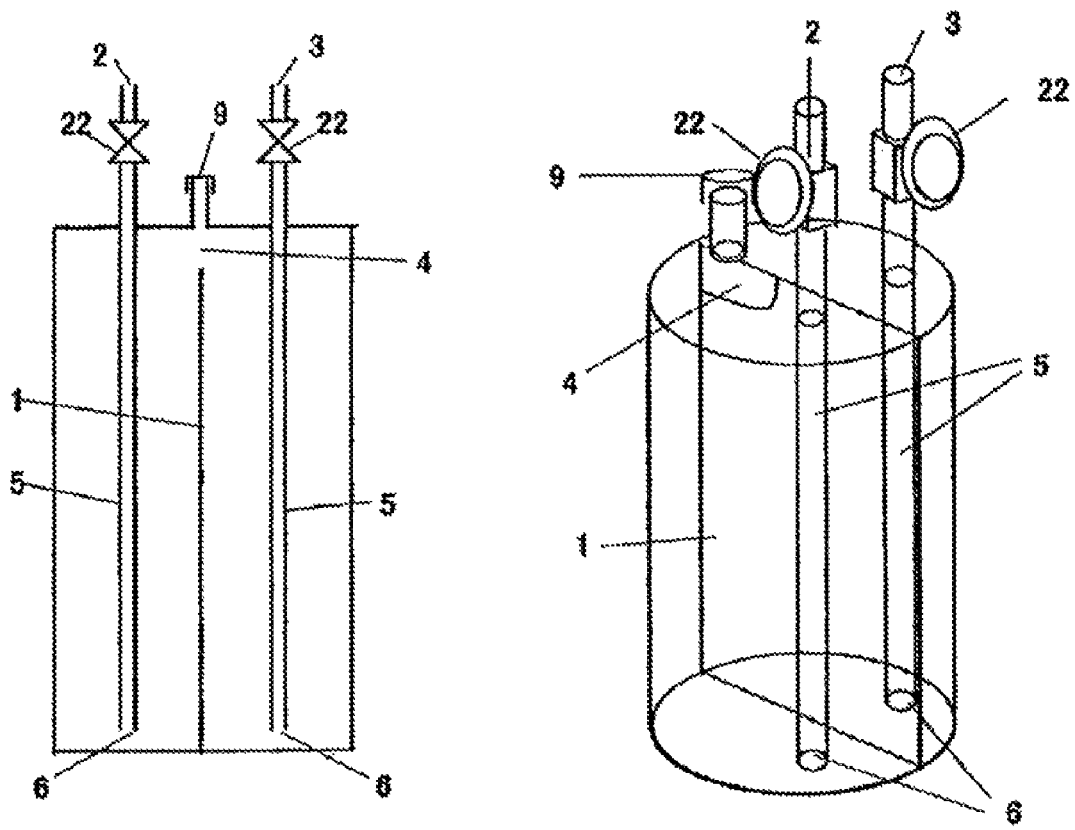
Figure 7:
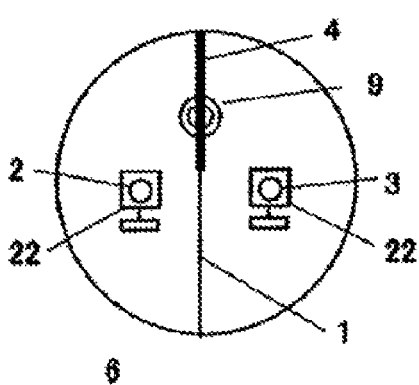
Figure 8:
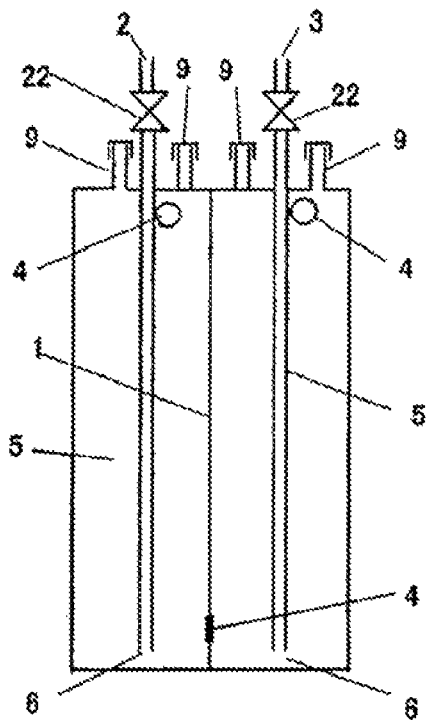
Figure 8:
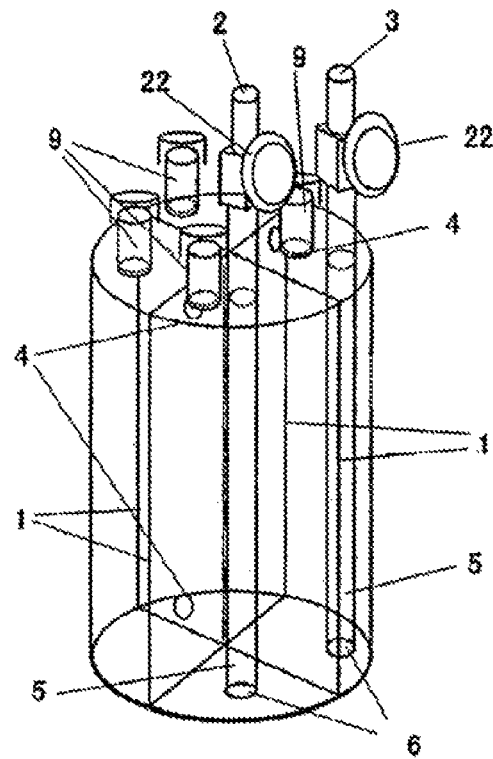
Figure 8:
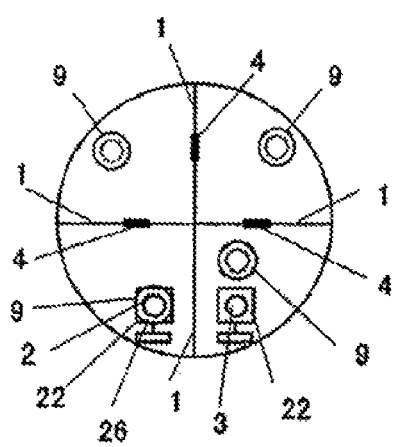

The structure of the filled container of the present invention is not particularly limited insofar as the interior space of the filled container is separated into a plurality of vertical compartments so as to allow carrier gas flow in each compartment.

The solid organometallic compound-filled container and the method of filling the filled container according to the present invention will now be described in more detail with reference to the accompanying drawings.

FIGS. 1(A) to 4(B) each represent one exemplary embodiment of a solid organometallic compound-filled container of the present invention. As shown in FIGS. 1(A) to 4(B), the solid organometallic compound-filled container of the present invention is constructed to have at least two partitioned compartments by separating the interior in the vertical direction with at least one partition (1). The space may be separated by the partition (1) in the manner as shown in FIGS. 1(A) to 4(B), for example.

The external form of the filled container may be polygonal prism, including a triangle prism, quadratic prism, pentagonal prism, and hexagonal prism, as well as the cylinder as shown in FIGS. 1(A) to 4(B).

Furthermore, the solid organometallic compound-filled container of the present invention has a carrier gas inlet (2) that leads to one of the compartments formed in the filled container by separation with the partition (1) and a carrier gas outlet (3) that leads to the other of the compartments, and has a structure as shown in FIGS. 1(A) to 4(B), for example. Carrier gas is introduced into the filled container filled with a solid organometallic compound via the carrier gas inlet (2), caused to flow in the filled container, discharged via the carrier gas outlet (3) in the form of gas that is saturated with the organometallic compound, and supplied to an MOCVD apparatus. The carrier gas inlet (2) and the carrier gas outlet (3) may be disposed, for example, at the upper part of the filled container or at the side face of the filled container depending on the manner of separation of the space by the partition (1), the form of use of the filled container and the like.

The partition (1) disposed inside the filled container of the present invention, as shown in FIGS. 1(A) to 4(B), has an opening (4) which allows the carrier gas to flow from the carrier gas inlet (2) to the carrier gas outlet (3) through each compartment in the filled container.

Examples of the partition (1) having such an opening (4) include those having the structures as shown in FIGS. 5(A) through 6(B).

The position of the opening (4) is not particularly limited insofar as it allows the carrier gas to sufficiently flow from the carrier gas inlet (2) to the carrier gas outlet (3) through the compartment filled with a solid organometallic compound, while allowing the filling solid organometallic compound to sufficiently contact with the carrier gas as well as not causing any trouble for stable supply of the organometallic compounds. In particular, when the opening (4) for passage of the carrier gas is disposed in the lower part of the partition (1) so as to effectively bring the filling solid organometallic compound and the carrier gas into contact with each other to achieve saturation, the opening (4) is disposed at less than or equal to one-third, preferably one-fifth, and more preferably at less than or equal to one-tenth of the internal height of the container, from the internal bottom of the filled container. When the opening (4) is disposed in the upper part of the partition (1), the opening (4) is disposed at more than or equal to two-thirds, preferably at more than or equal to four-fifths, and more preferably at more than or equal to nine-tenths of the internal height of the container from the internal bottom of the filled container.

Owing to the above structure, in the filled container of the present invention, the carrier gas is caused to flow in each compartment and discharged via the carrier gas outlet (3).

Exemplary structures of the partition (1) having the opening (4) in the filled container of the present invention include the structure shown in FIGS. 1(A) to 1(C) for a container having only one partition (1), the structure shown in FIGS. 2(A) and 2(B) for a container having two partitions (1), and the structures shown in FIGS. 3(A), 3(B) and 4(A), 4(B) for a container having three or more partitions (1).

Furthermore, depending on the position of the opening (4) provided in the partition (1), each of the carrier gas inlet (2) and the carrier gas outlet (3) may have a flow channel (5) for letting the carrier gas flow in every compartment from the carrier gas inlet (2) to the carrier gas outlet (3) through the opening (4). The structures shown in FIGS. 7(A) through 8(C) are examples of a filled container in which each of the carrier gas inlet (2) and the carrier gas outlet (3) is provided with the flow channel (5).

Figure 9:
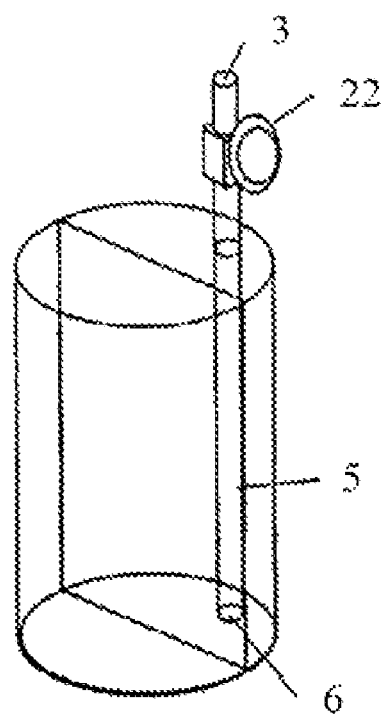
Figure 9:
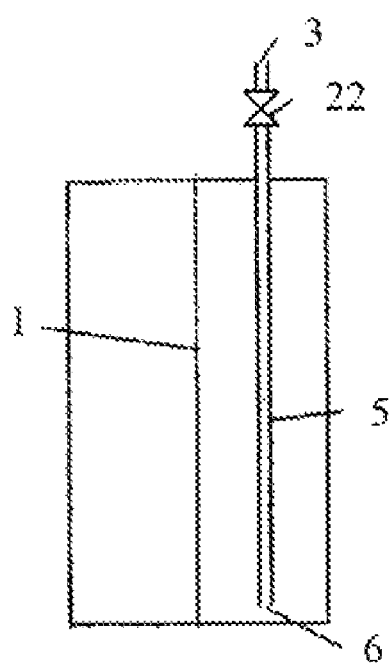
Figure 10:
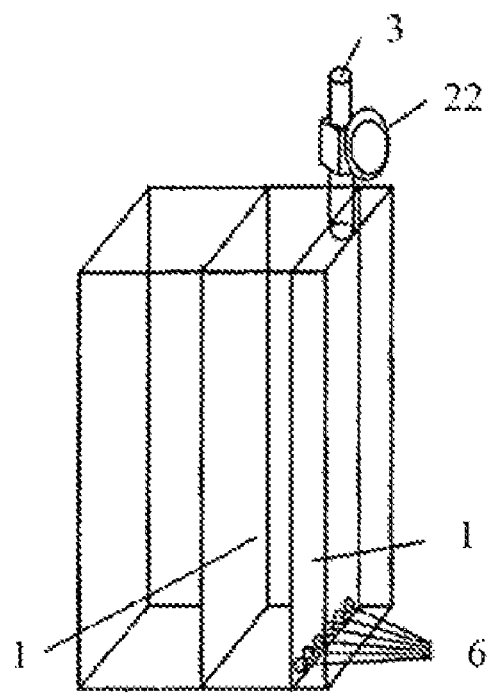
Figure 10:
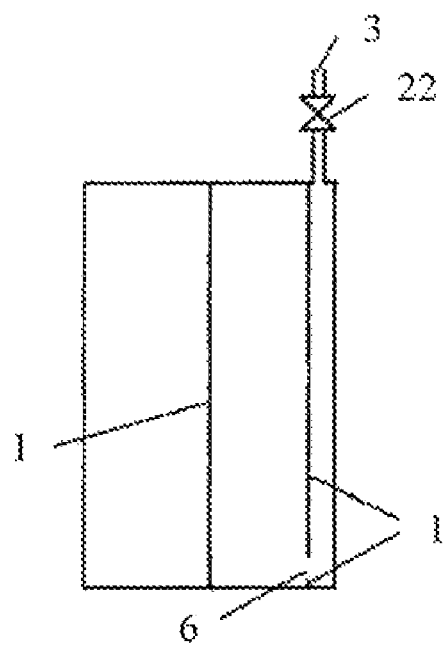

The flow channel (5) may be a tubular member as shown in FIGS. 9(A) and 9(B), or a member having flow channel lower openings (6) in the lower part of the structure formed by separating by the partition (1) as shown in FIGS. 10(A), 10(B), and 11(A), 11(B). Also the flow channel (5) may be a combination of a tubular member and the structure having flow channel lower openings (6) in the lower part of the structure formed by separating with the partition (1).

Desirably the flow channel lower openings (6) of the flow channel (5) are located at less than or equal to one-third, preferably at less than or equal to one-fifth, and more preferably at less than or equal to one-tenth of the internal height of the container from the internal bottom of the filled container.

The state of the carrier gas in the filled container of the present invention will be described with reference to FIGS. 1(A) to 1(C). First, the carrier gas introduced via the carrier gas inlet (2) flows in the compartment having the carrier gas inlet (2). The carrier gas having flowed through each compartment via the opening (4) is then discharged from the carrier gas outlet (3) and supplied to the MOCVD apparatus. The flow state of the carrier gas was explained with reference to FIGS. 1(A) to 1(C). However, when the interior of the filled container is partitioned into three or more compartments as shown in FIGS. 2(A) to 4(B), the carrier gas flows via the openings (4) provided in each partition (1).

In this flow state, when each of the carrier gas inlet (2) and the carrier gas outlet (3) has the flow channel (5) as shown in FIGS. 7(A) through 7(C), the carrier gas introduced via the carrier gas inlet (2) flows in the flow channel (5) and then flows in the compartment having the carrier gas inlet (2). After flowing in each compartment via the opening (4) and flowing in the flow channel (5) having the carrier gas outlet (3), the carrier gas is discharged via the carrier gas outlet (3) and supplied to the MOCVD apparatus.

When the filled container of the present invention is filled with a solid organometallic compound and used for supplying the MOCVD apparatus with the solid organometallic compound, the interior space of the filled container is filled with the solid organometallic compound.

As a method of filling a solid organometallic compound-filled container of the present invention with the solid organometallic compound, conventionally known methods can be used as they are. As such conventional filling methods, introduction of a solid organometallic compound into a filled container by sublimation, introduction of an organometallic compound into the filled container in the form of saturated vapor in a carrier gas, and introduction of a liquid organometallic compound obtained by heating the organometallic compound to its melting point or higher temperature are examples.

Figure 12:
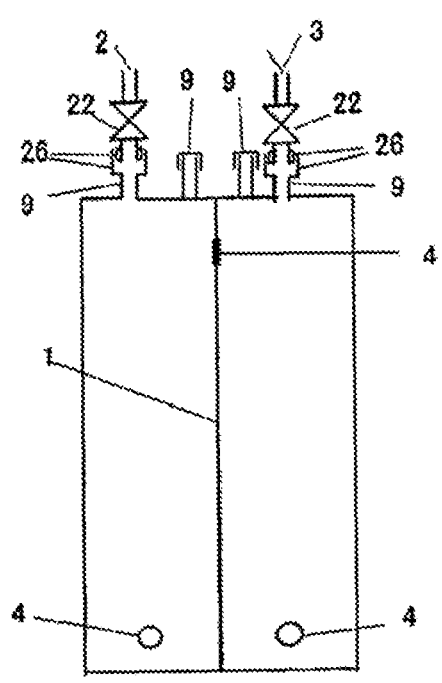
Figure 12:
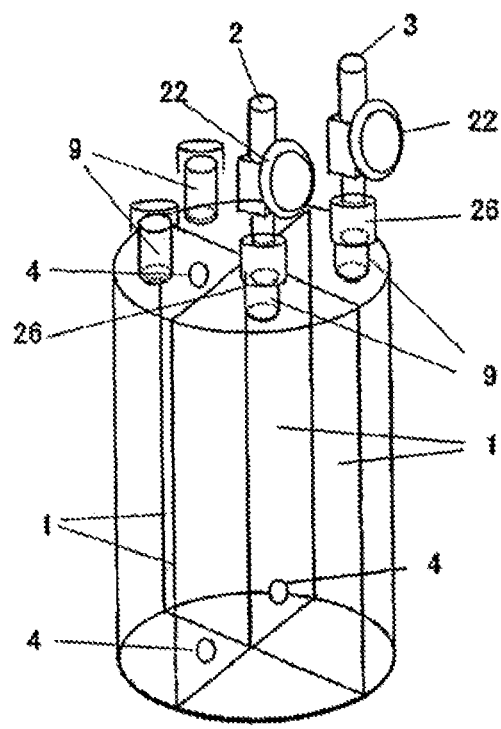
Figure 12:
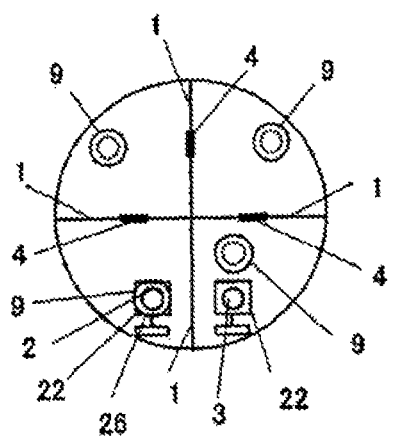
Figure 13:
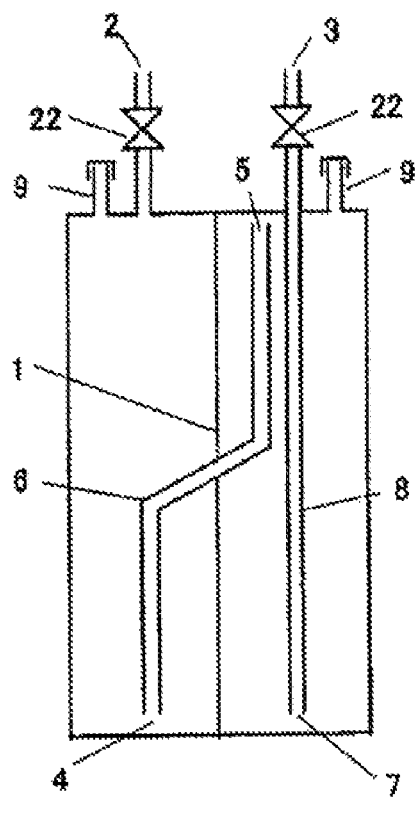
Figure 13:
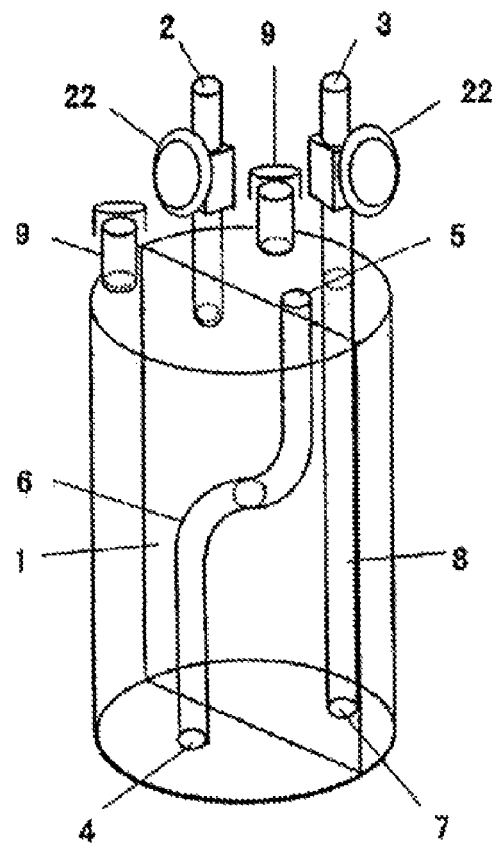
Figure 13:
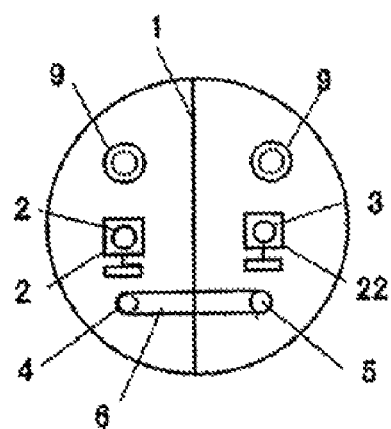
Figure 17:
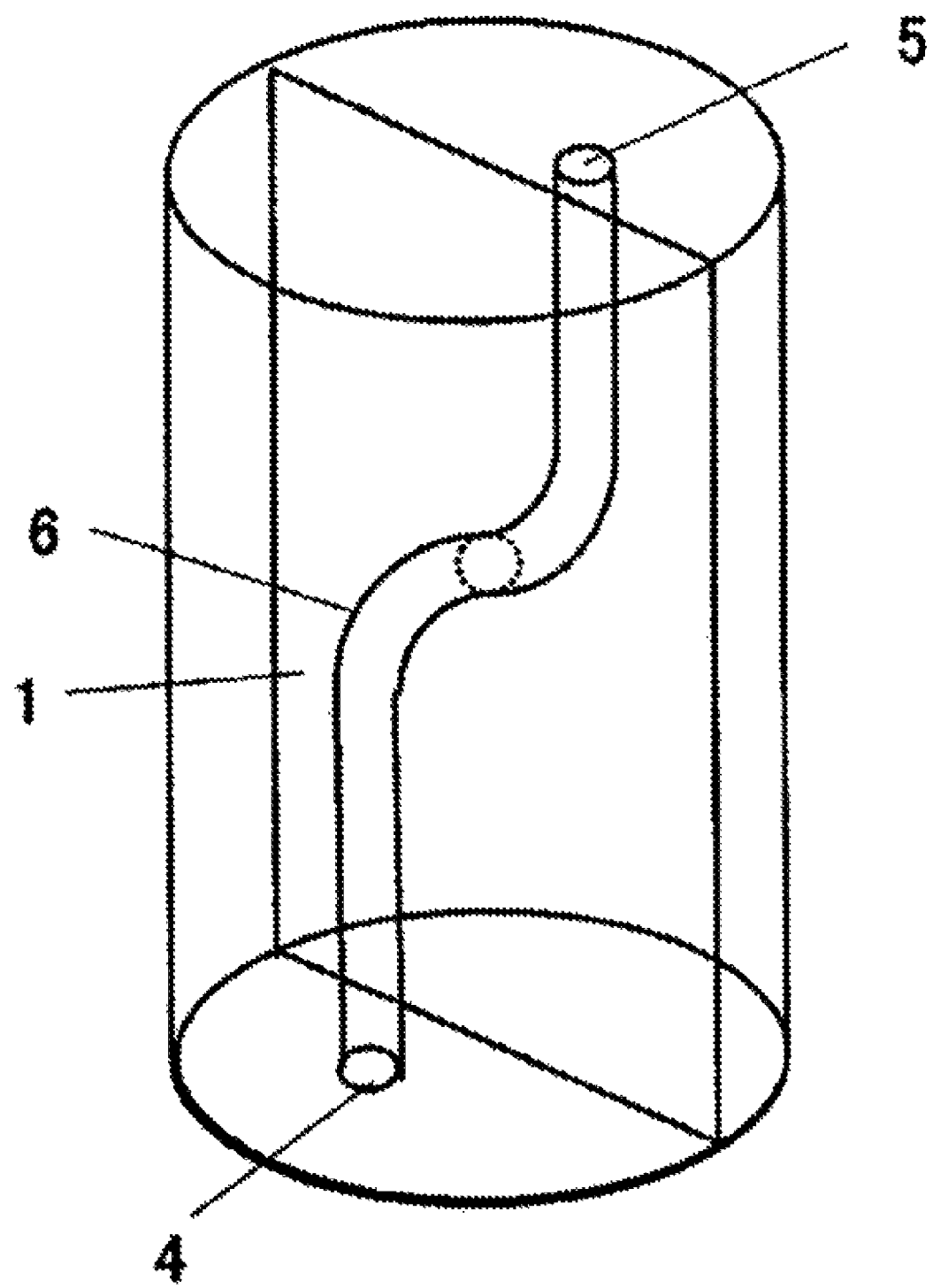
FIG. 17 is a perspective view of one embodiment of a filled container of the present invention.
Figure 18:
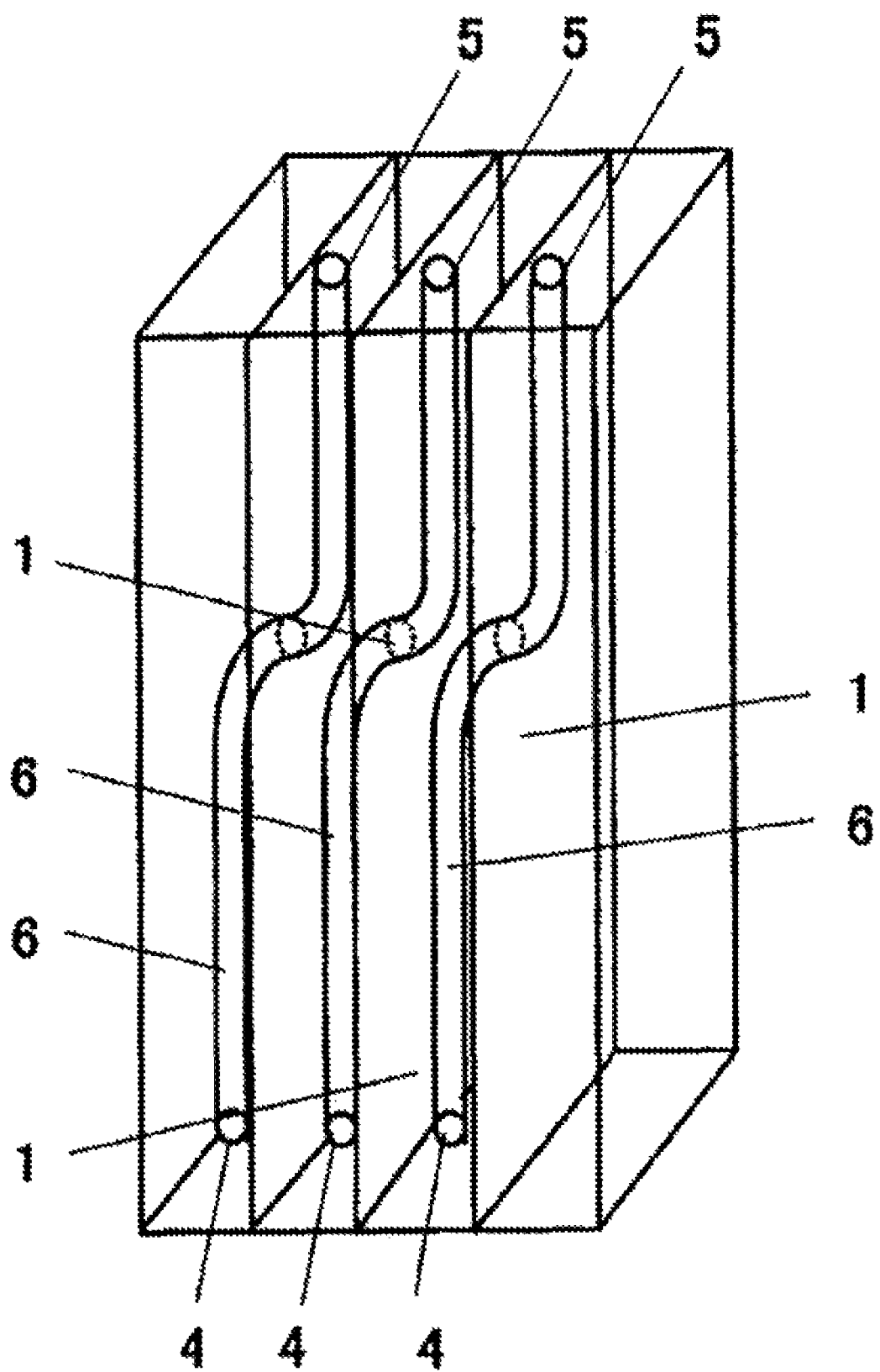
FIG. 18 is a perspective view of one embodiment of a filled container of the present invention.
Figure 19:
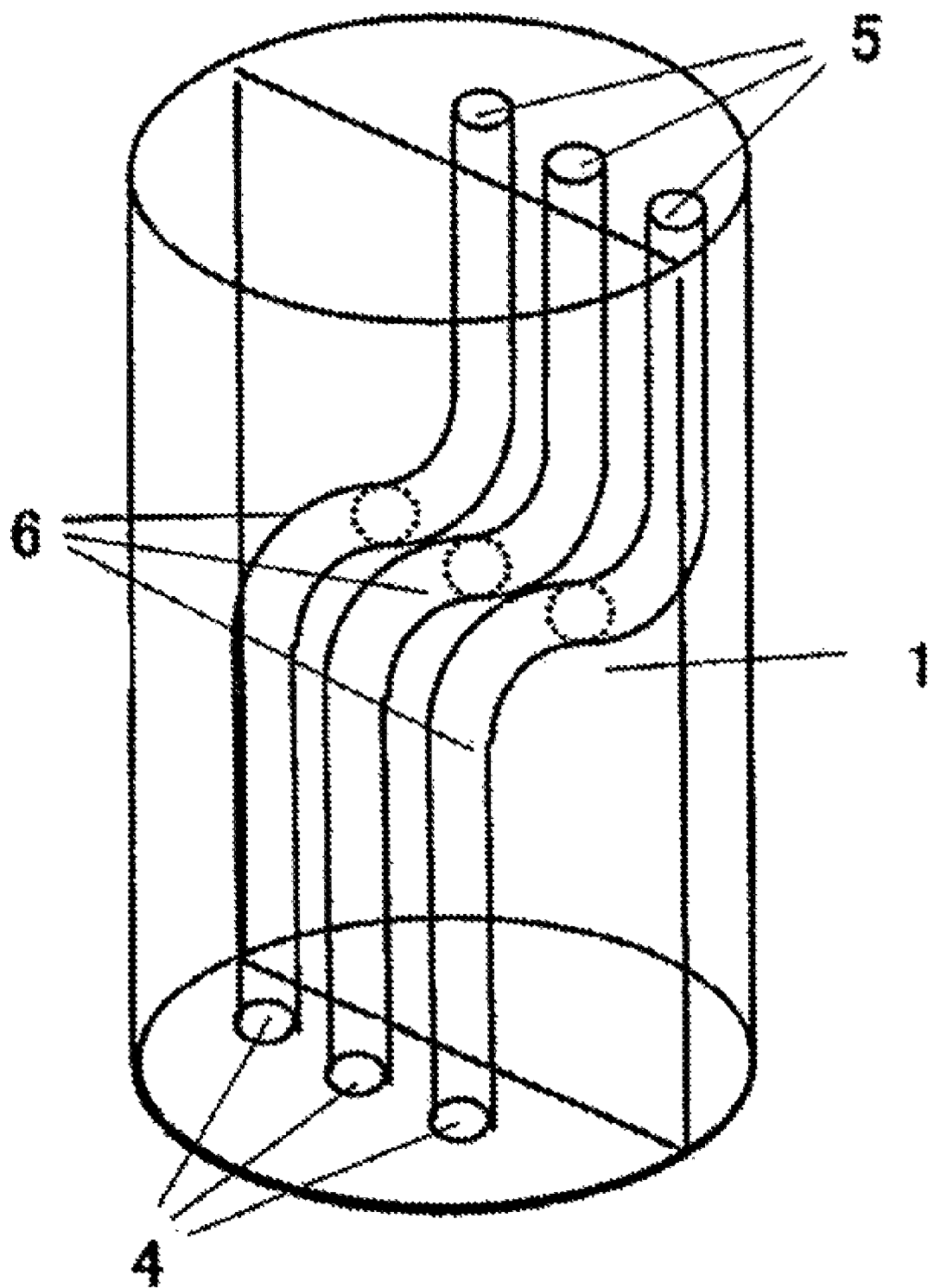
FIG. 19 is a perspective view of one embodiment of a filled container of the present invention.
Figure 20:
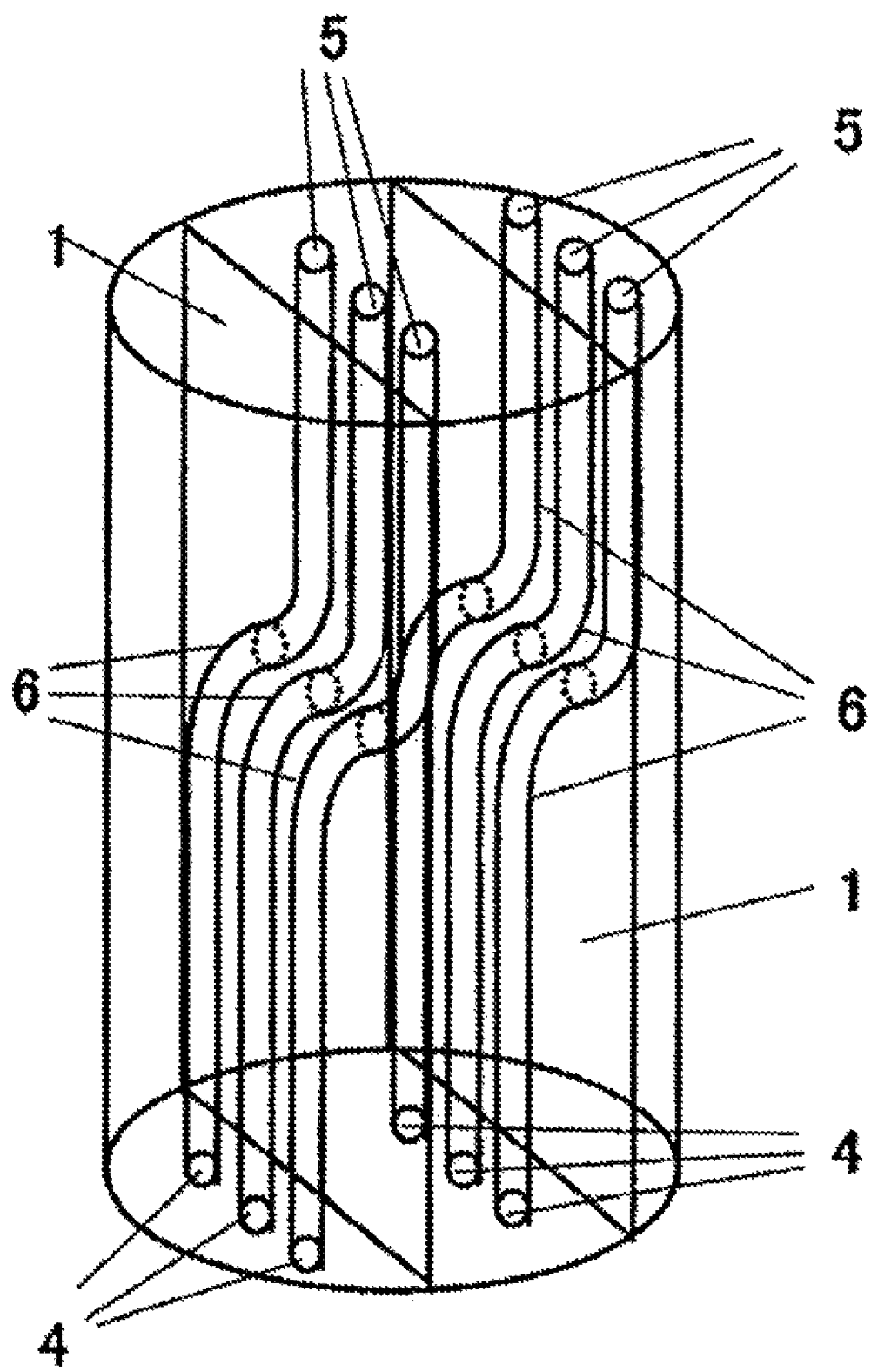
FIG. 20 is a perspective view of one embodiment of a filled container of the present invention.

Furthermore, in the solid organometallic compound-filled container of the present invention, a charging port (9) may be provided for filling the inside compartments of the filled container formed by the partition (1) with a solid organometallic compound. By providing this charging port (9), it becomes possible to introduce the solid organometallic compound in the solid form. In the present invention, the charging port of the filled container can be disposed, for example, in the upper part of the filled container as shown in FIGS. 1(A) to 4(B). By designing the carrier gas inlet (2) and/or the carrier gas outlet (3) to be detachable from the filled container, these carrier gas inlet (2) and/or carrier gas outlet (3) can function as the charging port (9) as well. The detached carrier gas inlet (2) and/or the carrier gas outlet (3) can be connected with the filled container again by a connector (26) before use. In one exemplary structure shown in FIGS. 12(A) through 12(C), the connector (26) that is detachable for forming the charging port is provided between the carrier gas inlet (2) and the filled container, with which the carrier gas inlet (2) and the filled container are connected again before use.

The filled container may or may not have the charging port depending on the filling method of a solid organometallic compound.

In the filled container of the present invention, as shown in FIGS. 1(A) to 4(B), for example, the carrier gas inlet (2) and the carrier gas outlet (3) may have a valve (22) that can be opened/closed. While the carrier gas flows, the valve (22) is opened, and while the organometallic compound is not supplied, the valve is usually closed to prevent the solid organometallic compound from being contaminated by the environment or from evaporating to the exterior of the filled container by sublimation.

In brief, the filled container of the present invention is designed so that the interior of the filled container is separated into a plurality of compartments by the partition (1), and the carrier gas introduced via the carrier gas inlet (2) passes through each compartment while contacting with the solid organometallic compound filling the container to flow to the carrier gas outlet (3). By separating the interior of the container with the partition (1) to form a plurality of compartments as described above, the section area of each compartment is reduced and the carrier gas can desirably contact with the solid organometallic compound. Accordingly, it is possible to keep the contact state of the carrier gas and the solid organometallic compound uniform without causing formation of a flow channel as is the case in the conventional art, so that it is possible to stably supply the MOCVD apparatus with the solid organometallic compound from the filled container at a constant concentration over a long term by the carrier gas.

According to the present invention, in the solid organometallic compound-filled container having the carrier gas inlet and the carrier gas outlet, wherein the interior of the filled container is separated into a plurality of vertical compartments, and the carrier gas introduced via the carrier gas inlet flows in each of the vertical compartments and is then discharged via the carrier gas outlet, the carrier gas introduced via the carrier gas inlet may be directed to flow in each of the vertical compartments in downward flow by carrier gas flow direction inverting means and discharged via the carrier gas outlet.

The structure of the filled container having the above structure according to the present invention is not particularly limited insofar as the interior space is separated into a plurality of vertical compartments, through which the carrier gas flows in downward flow.

The carrier gas flow direction inverting means of the present invention inverts the flow direction of the carrier gas flowing in one vertical compartment in downward flow and supplies the upper part of the next vertical compartment with the carrier gas in downward flow. Concrete examples of the carrier gas flow direction inverting means include, but are not limited to, those having a communicating channel in a partition as shown in FIGS. 13(A) to 20, those having a partition formed by a communicating channel as shown in FIGS. 21(A), 21(B), and 22(A), 22(B), and those having a partition forming a communicating channel as shown in FIGS. 23(A), 23(B), and 24(A), 24(B).

The solid organometallic compound-filled container of the present invention and its filling method will be described in more detail with reference to the drawings.

Examples of the solid organometallic compound-filled container of the present invention are shown in FIGS. 13(A) to 16(B). As shown in FIGS. 13(A) to 16(B), the solid organometallic compound-filled container of the present invention has at least two compartments formed by separating the interior of the filled container in the vertical direction with at least one partition (1). The partition (1) separates the space in the manner as shown in FIGS. 1(A) to 4(B), for example.

The external form of the filled container may be polygonal prism, including a triangle prism, quadratic prism, pentagonal prism and hexagonal prism, as well as the cylinder as shown in FIGS. 13(A) to 16(B).

Furthermore, the solid organometallic compound-filled container of the present invention has the carrier gas inlet (2) that leads to one of the compartments formed in the filled container by separation with the partition (1) and the carrier gas outlet (3) that leads to the other of the compartments, and has a structure as shown in FIGS. 13(A) to 16(B), for example. Carrier gas is introduced into the filled container filled with a solid organometallic compound via the carrier gas inlet (2) so as to flow in the filled container, and the gas saturated with the organometallic compounds is drawn out via the carrier gas outlet (3) to be supplied to an MOCVD apparatus. The carrier gas inlet (2) and the carrier gas outlet (3) may be disposed, for example, at the upper part of the filled container or the side face of the filled container depending on the manner of separating the space by the partition (1), the form of use of the filled container and the like.

The partition (1) disposed inside the filled container of the present invention, as shown in FIGS. 13(A) to 16(B), has the communicating channel (6) having the lower opening (4) and the upper opening (5) for letting the carrier gas flow from the carrier gas inlet (2) to the carrier gas outlet (3) through each compartment in the filled container.

The filled container of the present invention also has a structure such that the carrier gas introduced to the interior of the filled container is introduced via the lower opening (4) to the communicating channel (6) and then discharged via the upper opening (5), as shown in FIGS. 13(A) to 16(B).

Since the filled container of the present invention has the flow channel of the above structure, the carrier gas flows in each compartment and is discharged via the carrier gas outlet (3).

The filled container of the present invention also includes a discharging channel (8) having a lower opening (7) that discharges the carrier gas to the carrier gas outlet (3) from the lower part of the compartment having the carrier gas outlet (3), as shown in FIGS. 13(A) to 16(B).

In the filled container of the present invention, exemplary structures of the communicating channel (6) and the discharging channel (8) include the structure shown in FIGS. 13(A) to 13(C) for a container having only one partition (1), the structure shown in FIGS. 14(A) and 14(B) for a container having two partitions (1), and the structure shown in FIGS. 15(A), 15(B), or 16(A), 16(B) for a container having three or more partitions (1).

In the solid organometallic compound-filled container of the present invention, the communicating channel (6) may be configured by one or a plurality of tubular members as shown in FIGS. 17 to 20, for example.

The flow state of the carrier gas in the filled container of the present invention will be described with reference to FIGS. 13(A) to 13(C). First carrier gas introduced via the carrier gas inlet (2) flows down through the compartment having the carrier gas inlet (2). Then the carrier gas flows into the communicating channel (6) serving as carrier gas flow direction inverting means via the lower opening (4) thereof located near the bottom of the container, and flows up in the communicating channel (6) and is supplied to the upper part of the compartment having the carrier gas outlet (3). The carrier gas supplied to the upper part of the compartment having the carrier gas outlet (3) then flows down. Then the carrier gas flows up in the discharging channel (8) from the lower opening (7) of the discharging channel (8) located near the lower part of the compartment having the carrier gas outlet (3) and is then discharged via the carrier gas outlet (3) and supplied to the MOCVD apparatus. The flow state of the carrier gas has been explained according to FIGS. 13(A) to 13(C), however, when the interior of the filled container is separated into three or more compartments, as shown in FIGS. 14(A) to 16(B), the carrier gas flows down from top to bottom in each compartment through the communicating channel (6) provided at each partition (1).

A similar effect is achieved by employing a structure wherein the partition (1) also serves as the communicating channel (6) as shown in FIGS. 21(A) to 24(B). Containers having the following structures are examples of such a structure. In the structure shown in FIGS. 21(A) and 21(B), a plurality of tubular structures are aligned so as to adjoin each other along the length thereof while each interval is closed by the neighboring tubular structure. In the structure shown in FIGS. 22(A) and 22(B), each interval between adjacent tubular structures in FIGS. 21(A) and 21(B) is closed by the partition (1). An opening is provided in the lower part of the tubular structure on the side of the upstream compartment in respect of the carrier gas flow direction to serve as the lower opening (4), and an opening is provided in the upper part of the tubular structure on the side of the downstream compartment to serve as the upper opening (5). In the structure shown in FIGS. 23(A), 23(B), or FIGS. 24(A), 24(B), two partitions (1) are provided, wherein one partition (1) on the side of the upstream compartment in respect of the carrier gas flow direction is formed with openings in its lower part to serve as the lower opening (4), and the other partition (1) on the side of the downstream compartment is formed with openings in its upper part to serve as the upper opening (5). The communicating channel (6) may be of a tubular structure or of a structure combined with the structure wherein the partition (1) also severs as the communicating channel (6).

Figure 25:
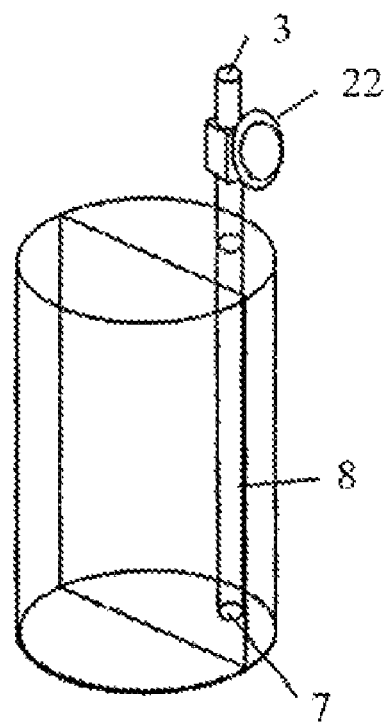
Figure 25:
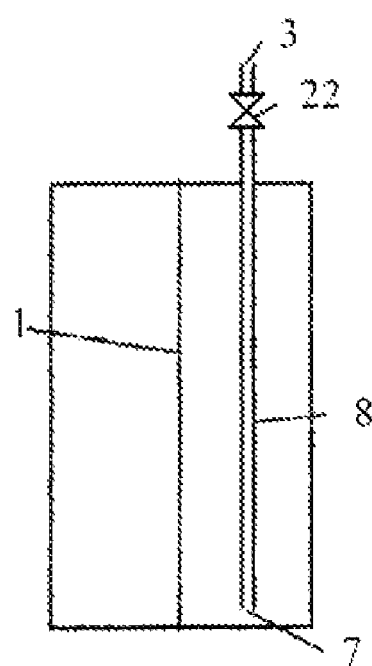

In the filled container of the present invention, the discharging channel (8) having the lower opening (7) that discharges the carrier gas to the carrier gas outlet (3) from the lower part of the compartment having the carrier gas outlet (3) may also have a tubular structure having an opening in the lower part as shown in FIGS. 25(A) and 25(B), or a structure as shown in FIGS. 26(A), 26(B), or FIGS. 27(A), 27(B) wherein the lower opening (7) is provided in the lower part of the structure separated by the partition (1) and the like. The discharging channel (8) may be of the tubular structure as described above or the structure combined with the structure having the lower opening (7) in the lower part of the structure separated by the partition (1).

Furthermore, according to the solid organometallic compound-filled container of the present invention, in the communicating channel (6) having the lower opening (4) and the upper opening (5) for allowing the carrier gas to pass through, and the discharging channel (8) having the lower opening (7) for discharging the carrier gas to the carrier gas outlet (3) from the lower part of the compartment having the carrier gas outlet (3), the positions of the upper opening (5) and the lower opening (4) are not particularly limited insofar as the carrier gas can sufficiently flow from the carrier gas inlet (2) to the carrier gas outlet (3) through the compartment filled with the solid organometallic compound, through the communicating channel (6) and through the discharging channel (8) having the lower opening (7) from which the carrier gas is discharged to the carrier gas outlet (3), and the filling solid organometallic compound can sufficiently contact with the carrier gas, wherein stable supply of the organometallic compounds is not disturbed. In order to effectively bring the filling solid organometallic compound into contact with the carrier gas to achieve saturation, in the communicating channel (6) with the lower opening (4) and the upper opening (5) for allowing passage of the carrier gas, it is desired that the lower opening (4) be positioned at less than or equal to one third, preferably at less than or equal to one fifth, more preferably at less than or equal to one tenth of the height of the container from the internal bottom of the filled container, and the upper opening (5) be positioned at more than or equal to two-thirds, preferably at more than or equal to four-fifths, more preferably at more than or equal to nine tenths of the height of the container from the internal bottom of the filled container. Also, in the discharging channel (8) having the lower opening (7) that discharges the carrier gas to the carrier gas outlet (3) from the lower part of the compartment having the carrier gas outlet (3), it is desired that the lower opening (7) be positioned at less than or equal to one third, preferably at less than or equal to one fifth, more preferably at less than or equal to one tenth of the height of the container from the internal bottom of the filled container.

When the filled container of the present invention is filled with a solid organometallic compound and used for supplying the MOCVD apparatus with the solid organometallic compound, the interior space of the filled container is filled with the solid organometallic compound.

As a method of filling a solid organometallic compound-filled container of the present invention with the solid organometallic compound, conventionally known methods can be used as they are. As such conventional filling methods, introduction of a solid organometallic compound into a filled container by sublimation, introduction of an organometallic compound into the filled container in the form of saturated vapor in the carrier gas, and introduction of a liquid organometallic compound obtained by heating the organometallic compound to its melting point or higher temperature are examples.

Furthermore, in the solid organometallic compound-filled container of the present invention, a charging port (9) may be provided for filling the inside compartments of the filled container formed by the partition (1) with a solid organometallic compound. By providing this charging port (9), it becomes possible to introduce the solid organometallic compound in solid form. In the present invention, the charging port of the filled container can be disposed, for example, in the upper part of the filled container as shown in FIGS. 13(A) to 16(C). Also, by designing the carrier gas inlet (2) and/or the carrier gas outlet (3) to be detachable from the filled container, the carrier gas inlet (2) and/or the carrier gas outlet (3) can function also as the charging port (9). The detached carrier gas inlet (2) and/or the carrier gas outlet (3) can be connected again with the filled container by a connector (26) before use. At this time, if the discharging channel (8) to be connected to the carrier gas outlet (3) is detachable, filling with the solid organometallic compound can be facilitated. In one exemplary structure shown in FIGS. 28(A) through 29(C), the connector (26) that is detachable for forming the charging port is provided between the carrier gas inlet (2) and the filled container, with which connector the carrier gas inlet (2) and the filled container are connected again before use.

The filled container may or may not have the charging port depending on the filling method of the solid organometallic compound.

In the filled container of the present invention, as shown in FIGS. 13(A) to 16(B), the carrier gas inlet (2) and the carrier gas outlet (3) may have a valve (22) that can be opened/closed. While the carrier gas flows, the valve (22) is opened, and while the organometallic compound is not supplied, the valve is usually closed to prevent the solid organometallic compound from being contaminated by the environment or from evaporating to the exterior of the filled container by sublimation.

In brief, as for the filled container having the carrier gas flow direction inverting means, the filled container of the present invention is designed so that the interior of the filled container is separated into a plurality of compartments by the partition (1), and the carrier gas introduced via the carrier gas inlet (2) passes through the solid organometallic compound filling each compartment of the container from top to bottom thereof in every compartment to flow to the carrier gas outlet (3). By separating the interior of the container with the partition (1) to form a plurality of compartments as described above, the sectional area of each compartment is reduced and the carrier gas can desirably contact with the solid organometallic compound. Accordingly, it is possible to keep the contacting state of the carrier gas and the solid organometallic compound uniform without causing formation of a flow channel as is the case with the conventional art, so that it is possible to stably supply the MOCVD apparatus with the solid organometallic compound from the filled container at a constant concentration over a long term with the carrier gas.

As the solid organometallic compound that can be used for filling the filled container of the present invention, not only the known solid organometallic compounds that have been used in a conventional filled container, but also other solid organometallic compounds are applicable, insofar as they have enough saturated vapor pressure to achieve the desired supply to the carrier gas under the temperature and pressure used for supply by means of the carrier gas, and are in a solid state under the supply conditions. Representative examples of these solid organometallic compounds include alkyl metal compounds, metallocene compounds, β-diketone complexes, and adduct compounds. Specifically, the examples thereof include: alkyl metal compounds such as trimethylindium, dimethylchloroindium, triphenylaluminum, triphenylbismuth, and tert-butyllithium; metallocene compounds such as cyclopentadienylindium, bis(cyclopentadienyl)magnesium, bis(cyclopentadienyl)manganese, and ferrocene; β-diketone complexes such as barium acetylacetonato complex, strontium acetylacetonato complex, copper acetylacetonato complex, calcium acetylacetonato complex, barium dipivaloyl methanato complex, strontium dipivaloyl methanato complex, copper dipivaloyl methanato complex, yttrium dipivaloyl methanato complex, and calcium dipivaloyl methanato complex; and adduct compounds such as trimethylindium-trimethylarsine adduct, trimethylindium-trimethylphosphine adduct, and barium dipivaloyl methanato-1,10-phenanthroline adduct.

As for the pressure under which the filled container of the present invention is used, any conditions that are conventionally used in a filled container can be used without modification, and conditions that allow stable supply of the solid organometallic compound to the MOCVD apparatus over a long term can be used without any restriction. Any of elevated pressures, normal pressures, and reduced pressures are available, however, pressures around normal pressures to reduced pressures are usually employed.

Also, as for the temperature at which the filled container of the present invention is used, any conditions that are conventionally used in a filled container can be used without modification, and the conditions under which a commonly used solid organometallic compound has a saturated vapor pressure that is sufficient to supply the carrier gas as desired and in which the solid organometallic compound is solid in the supply condition are possible. In the filled container of the present invention, any kinds of carrier gas that are conventionally used in filled containers can be used, including inert gases such as nitrogen, argon, and helium, and hydrogen gas.

Furthermore, in the filled container of the present invention, known packing materials that are used together with a solid organometallic compound for filling the known filled container can be used. As such packing materials, those made of stainless steel, glass, ceramics, fluorine plastic, and the like are used, and those made of stainless steel are preferably used. The packing material may have round, square, cylinder, coil, spring, globular and other shapes, and examples of these include various packing for distillation such as Dixon packing, Helipack, Fenske, and the like. Also, fibrous packing materials may be used.

These packing materials can be used together with the solid organometallic compound for filling the filled container by a know method in the filled container of the present invention.

The filled container of the present invention is used as a filled container not only for the solid organometallic compound but also for general solid substances such as solid inorganic compounds, solid organic compounds, or solid metals having different vapor pressures. Therefore, the filled container of the present invention can be used for drawing out other solid substances in place of the solid organometallic compound in the form of saturated gas by using a carrier gas.

In the following, the present invention will be described in more detail by way of examples.

EXAMPLE 1

Supply stability of the solid organometallic compound was examined by using trimethylindium as the solid organometallic compound in the filled container shown in FIGS. 7(A) to 7(C).

The supply stability test was conducted in the manner below.

Under nitrogen atmosphere, a filled container formed of SUS and having an outer diameter of 76.0 mmΦ as shown in FIGS. 7(A) to 7(C) was filled with 400 g of trimethylindium and 647 g of stainless packing material via the charging port (9).

Next, the carrier gas outlet (3) was connected to a trap for trapping trimethylindium that was cooled on dry ice/methanol. Piping that connects the carrier gas outlet (3) and the trap cooled on dry ice/methanol was heated so that trimethylindium would not precipitate in this piping. The filled container filled with trimethylindium and the packing material was placed in a temperature controlled bath set at 25° C., 500 cc per minute of nitrogen gas was fed via the carrier gas inlet (2) of the filled container under the condition that the internal pressure of the appliance system for the supply stability test was adjusted to nearly atmospheric pressure, and the weight of trimethylindium trapped in the trap cooled on dry ice/methanol was measured every eight hours. Also the gas concentration of the gas phase of carrier gas containing vapor of trimethylindium was determined by using an ultrasonic type gas densitometer ("EPISON"™ available from Thomas Swan Scientific Equipment Ltd.).

Figure 30:
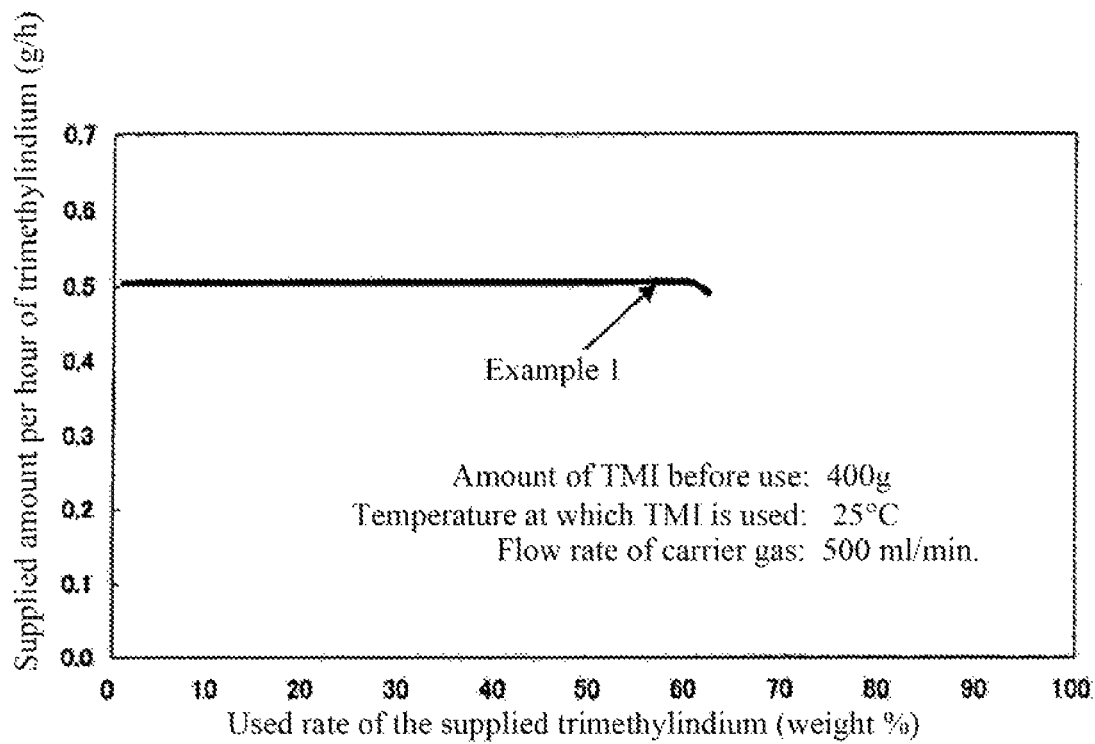
FIG. 30 is a graph representing a result of the supply stability test of trimethylindium in Example 1 (representing the relation between used rate of supplied trimethylindium and supply amount of trimethylindium per hour)

The result is shown in FIG. 30. In the graph of FIG. 30, the vertical axis represents supplied amount per hour of trimethylindium, and the horizontal axis represents used rate of the supplied trimethylindium in % by weight.

The result of the supply stability test demonstrated that when the filled container of the present invention was used, the supply speed of trimethylindium was stable up to the used rate of 62% by weight.

As demonstrated in this test, the filled container shown in FIGS. 7(A) to 7(C) makes it possible to stably supply a solid organometallic compound at a constant concentration, and enables the used rate of the solid organometallic compound to be increased under the condition where stable supply speed is achieved. As a result, it is possible to elongate the period during which the solid organometallic compound can be stably supplied by using the filled container of the present invention.

COMPARATIVE EXAMPLE 1

Figure 31:
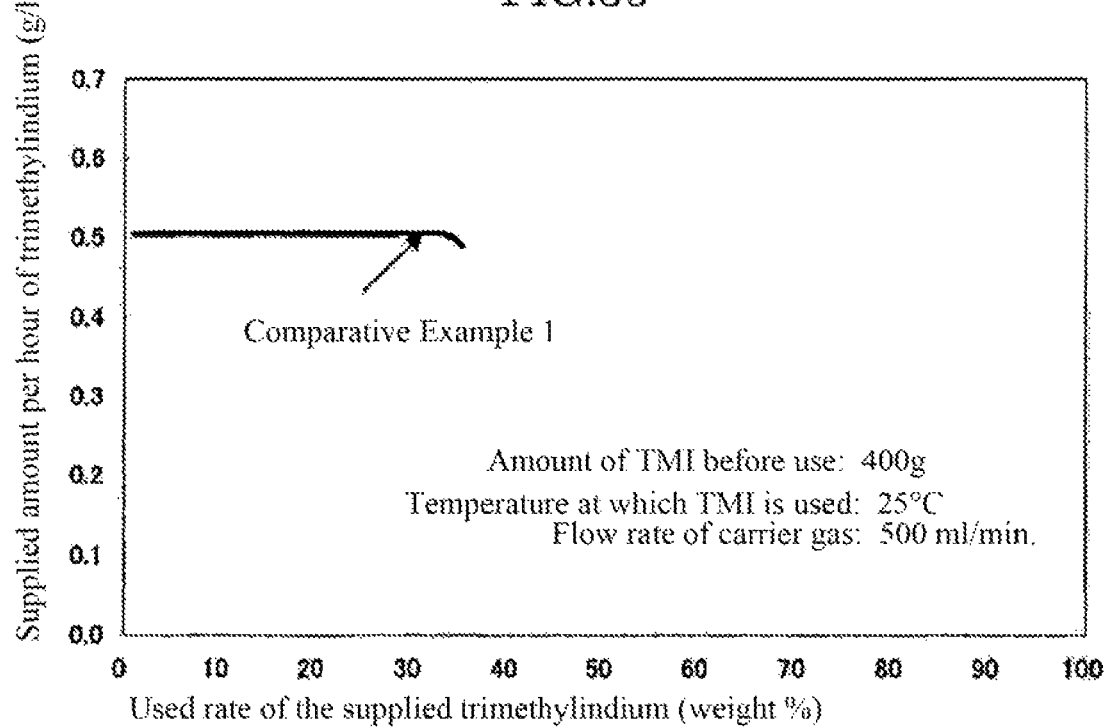
FIG. 31 is a graph representing a result of the supply stability test of trimethylindium in Comparative example 1 (representing the relation between used rate of supplied trimethylindium and supply amount of trimethylindium per hour)
Figure 34:
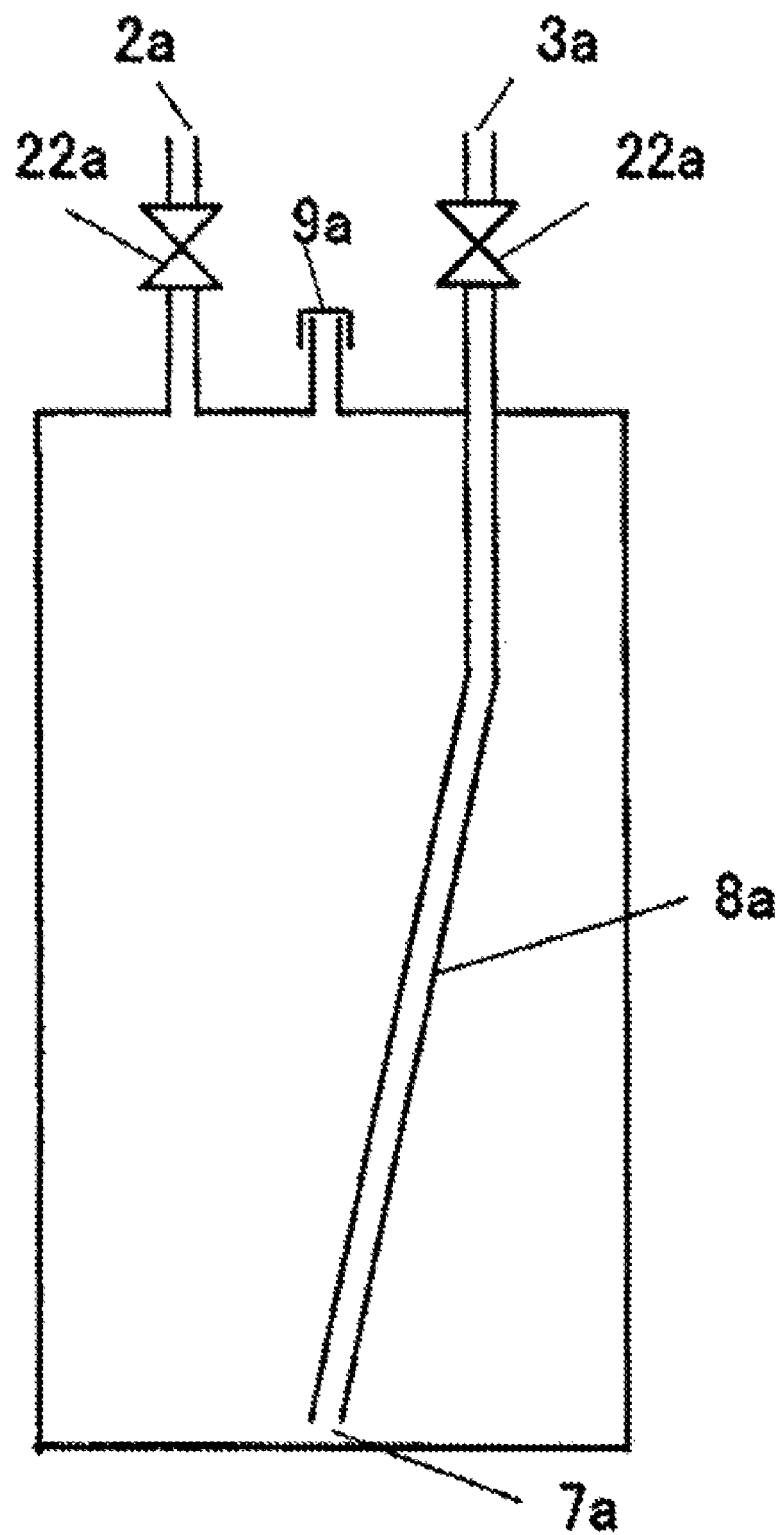
FIG. 34 is a schematic cross sectional view of a conventional filled container A.
Figure 35:
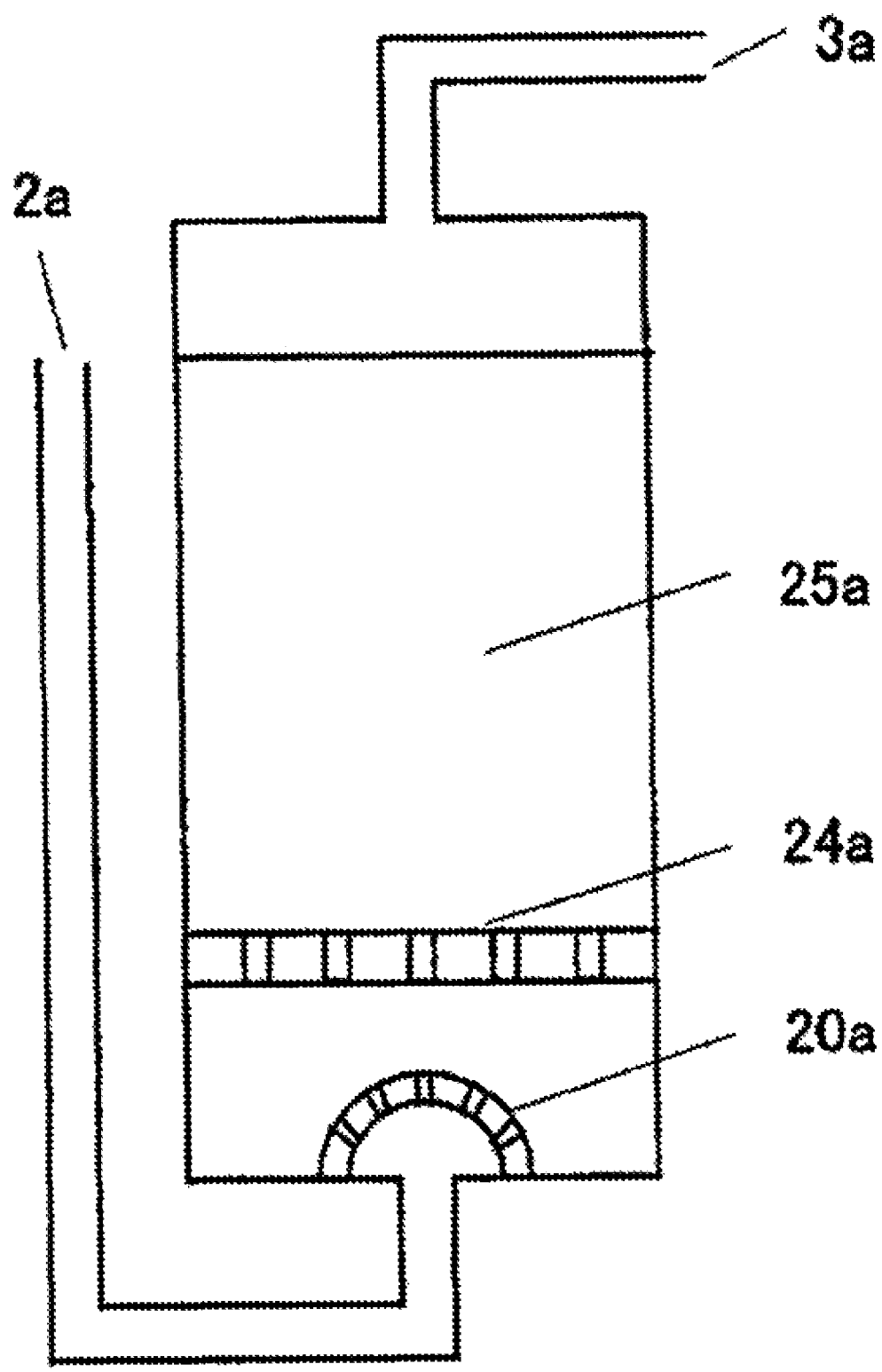
FIG. 35 is a schematic cross sectional view of a conventional filled container B.
Figure 36:
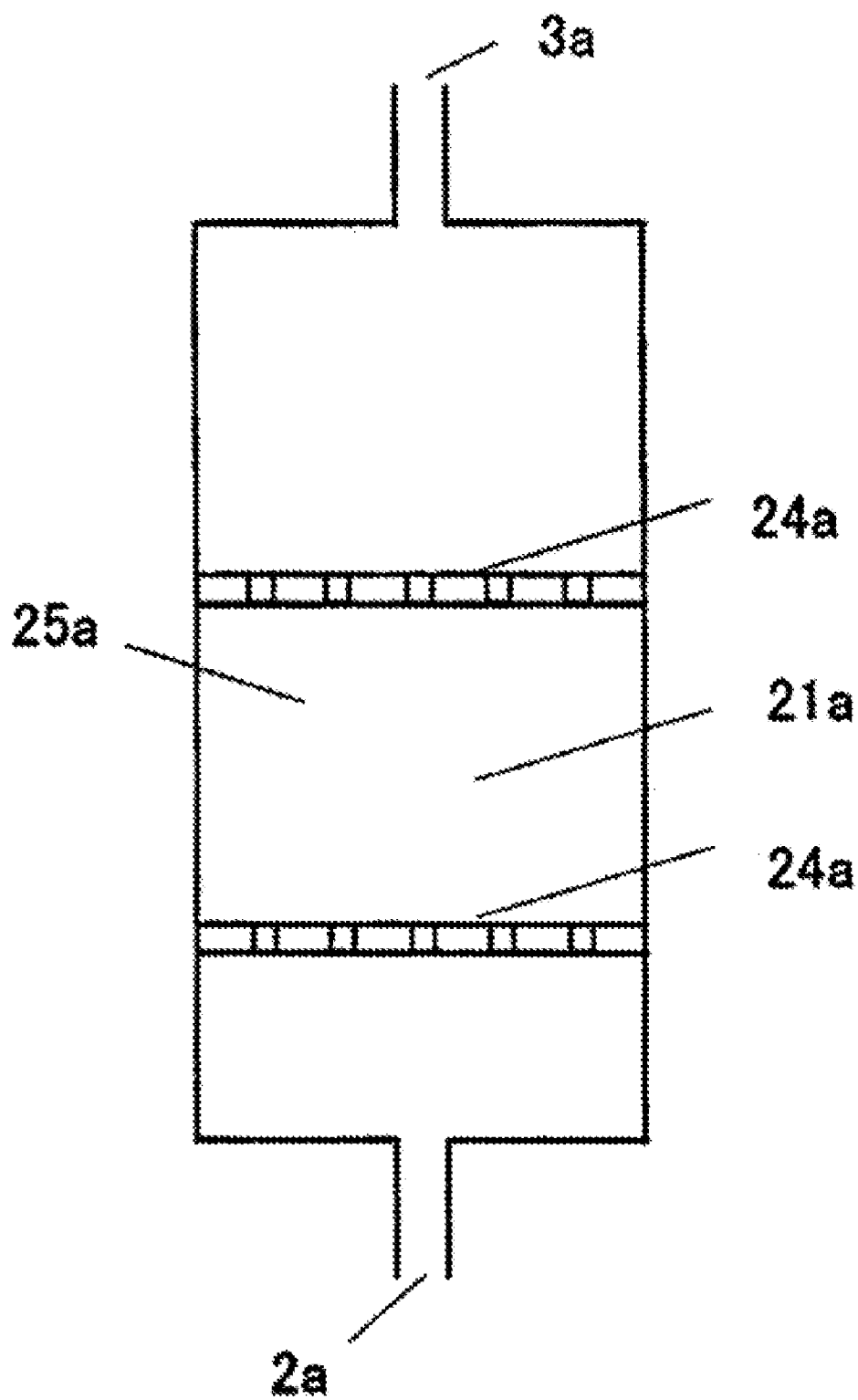
FIG. 36 is a schematic cross sectional view of a conventional filled container C.
Figure 37:
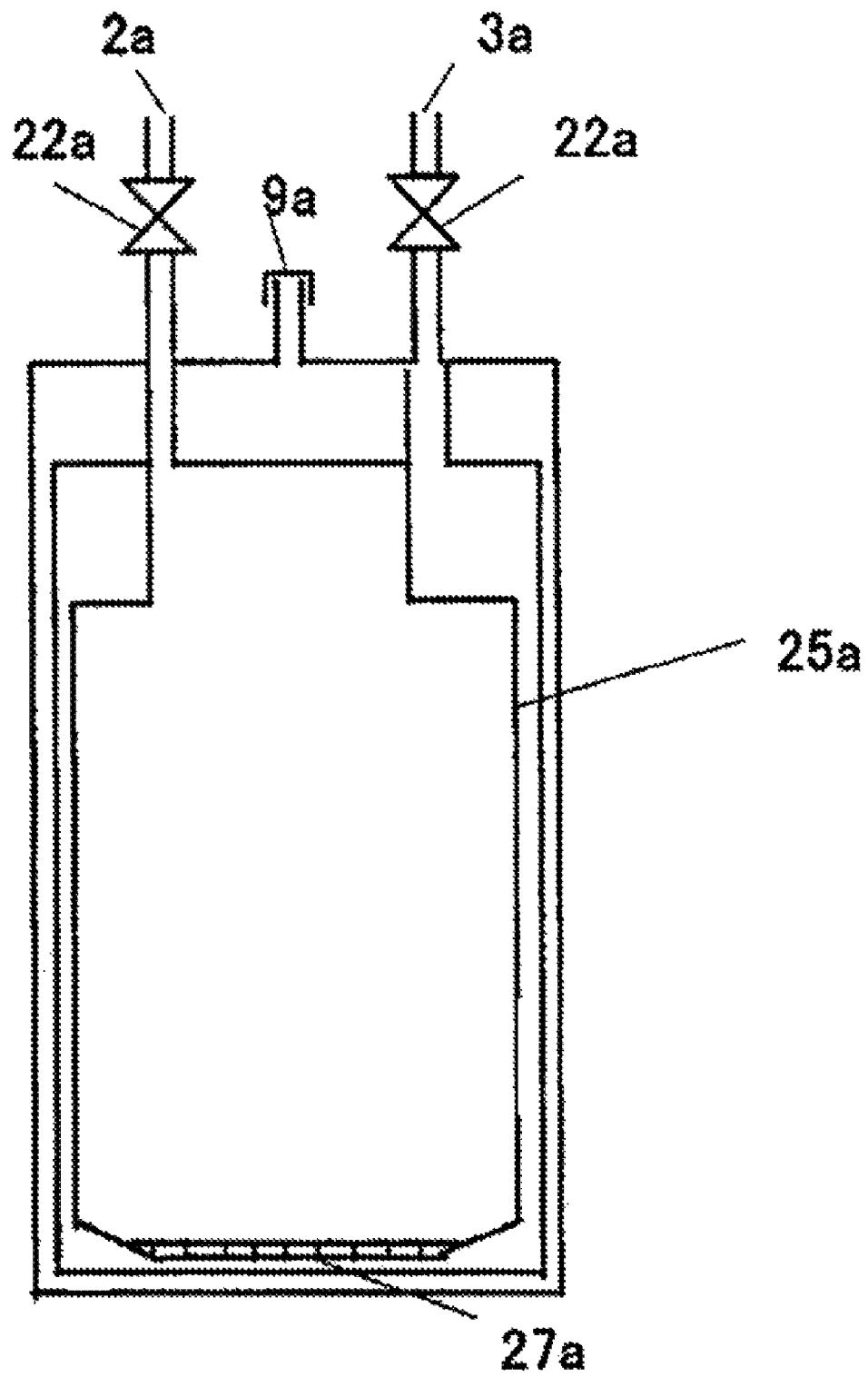
FIG. 37 is a schematic cross sectional view of a conventional filled container D.

A conventional filled container A shown in FIG. 34 was filled with trimethylindium as a solid organometallic compound and supply stability of the solid organometallic compound was examined in the same manner as described in Example 1. The result is shown in FIG. 31. The result of the supply stability test demonstrated that when the conventional filled container A shown in FIG. 34 was used, the supply speed of trimethylindium was stable up to the used rate of 35% by weight.

EXAMPLE 2

Figure 28:
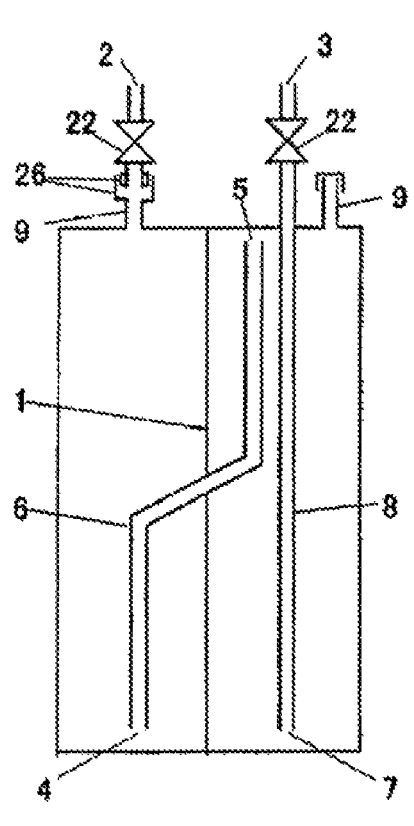
Figure 28:
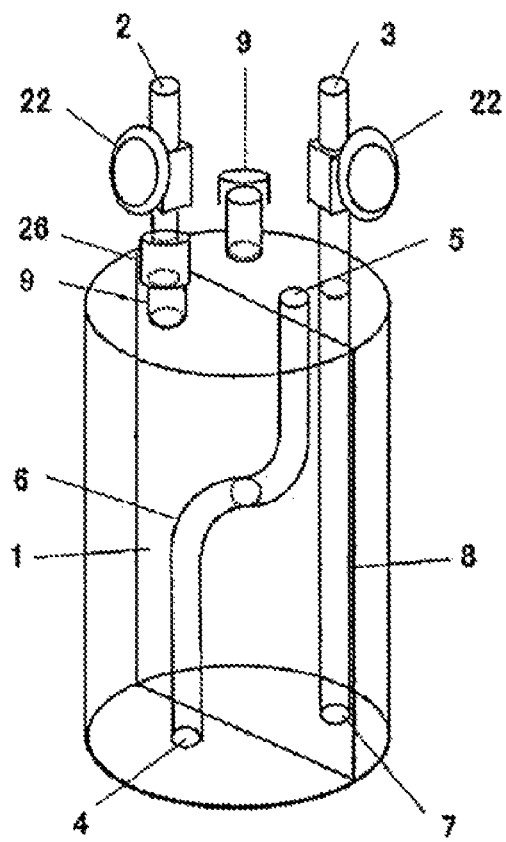
Figure 28:
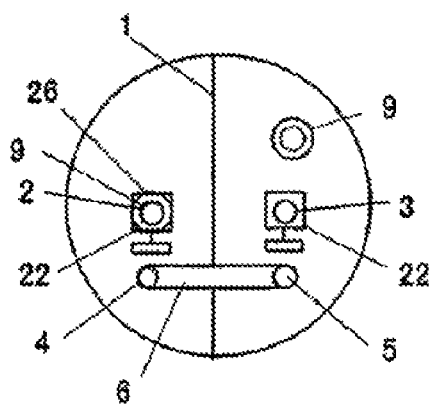
Figure 29:
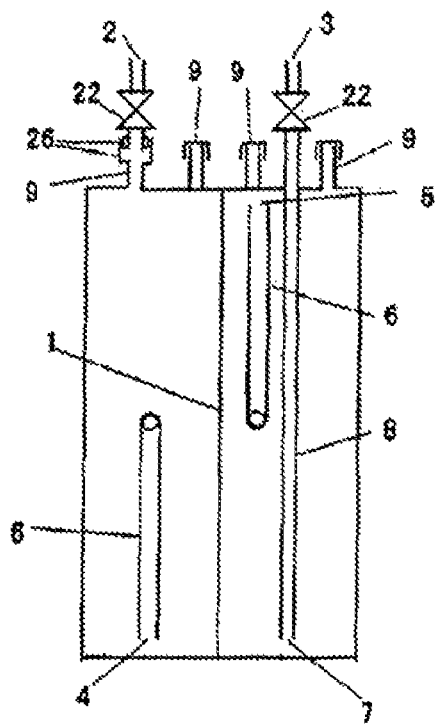
Figure 29:
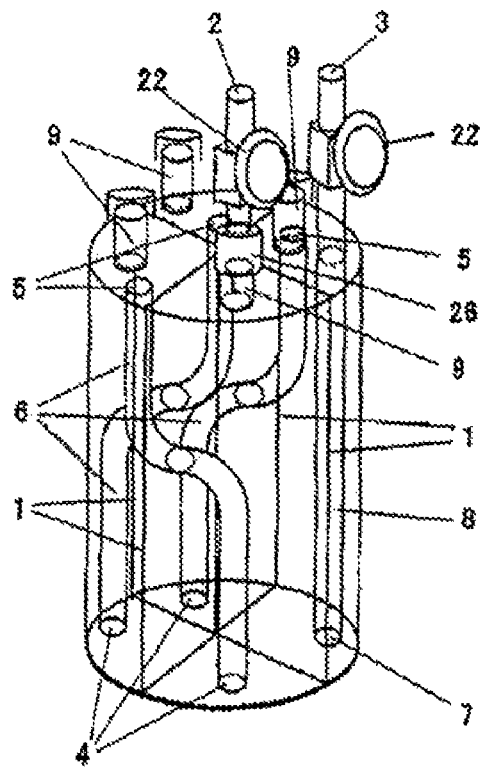
Figure 29:
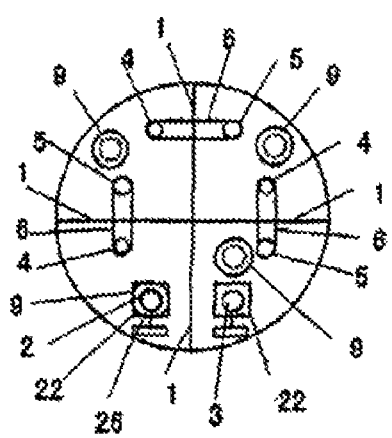

Supply stability of solid organometallic was examined by using trimethylindium as a solid organometallic compound in the filled container shown in FIG. 28.

The supply stability test was conducted in the following manner.

Under a nitrogen atmosphere, a filled container formed of SUS and having an outer diameter of 60.5 mmΦ as shown in FIGS. 28(A) to 28(C) was filled with 200 g of trimethylindium and 260 g of stainless packing material via the charging port (9). In this filling operation, when trimethylindium was fed into the inside space of the filled container having the carrier gas inlet (2), the carrier gas inlet (2) was detached from the filled container at the connector (26) for giving the charging port (9).

Next, the carrier gas outlet (3) was connected to a trap for trapping trimethylindium that was cooled on dry ice/methanol. Piping that connects the carrier gas outlet (3) and the trap cooled on dry ice/methanol was heated so that trimethylindium would not precipitate in this piping. The filled container filled with trimethylindium and the packing material was placed in a temperature controlled bath set at 25° C., 500 cc per minute of nitrogen gas was introduced via the carrier gas inlet (2) of the filled container under the condition that the internal pressure of the appliance system for the supply stability test was adjusted to nearly atmospheric pressure, and the weight of trimethylindium trapped in the trap cooled on dry ice/methanol was measured every eight hours. Also, the gas concentration of the gas phase of carrier gas containing vapor of trimethylindium was determined by using a ultrasonic type gas densitometer ("EPISON"™ available from Thomas Swan Scientific Equipment Ltd.).

Figure 32:
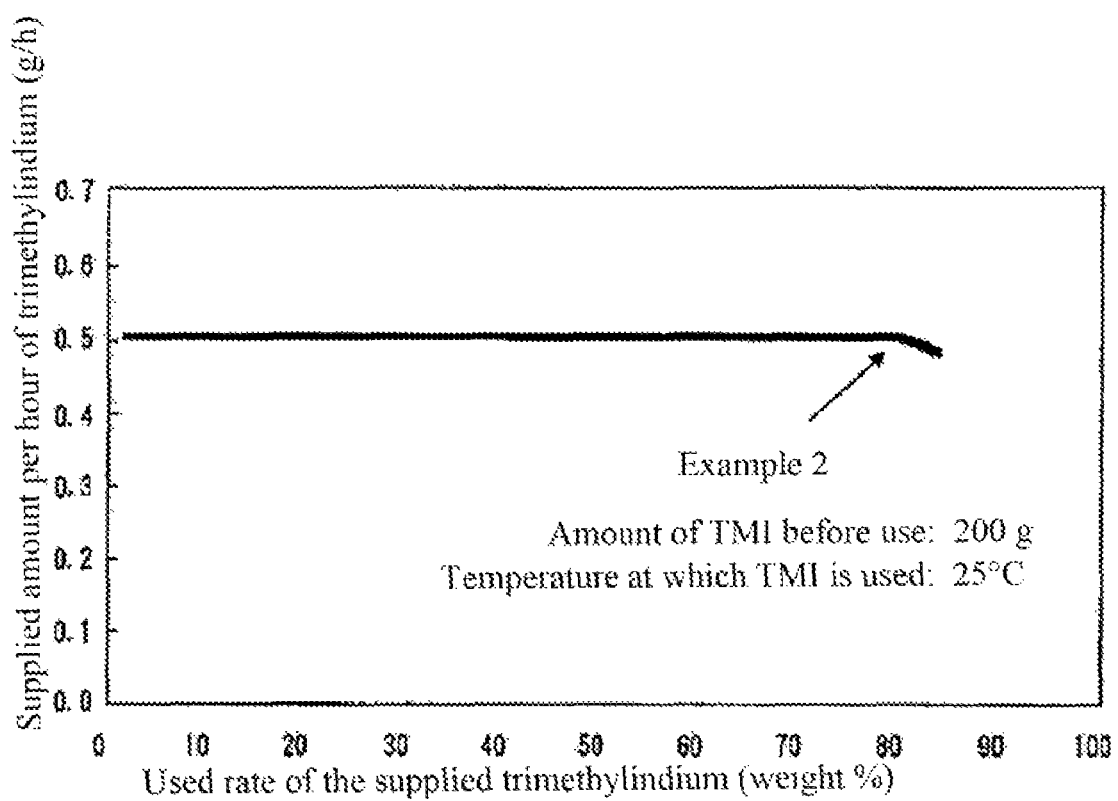
FIG. 32 is a graph representing a result of the supply stability test of trimethylindium in Example 2 (representing the relation between used rate of supplied trimethylindium and supply amount of trimethylindium per hour)

The result is shown in FIG. 32. In the graph of FIG. 32, the vertical axis represents supplied amount per hour of trimethylindium, and the horizontal axis represents used rate of the supplied trimethylindium in % by weight.

The result of the supply stability test demonstrated that when the filled container of the present invention was used, the supply speed of trimethylindium was stable up to the used rate of 85% by weight.

As demonstrated in this test, the filled container shown in FIGS. 28(A) to 28(C) makes it possible to stably supply a solid organometallic compound at a constant concentration, and enables the used rate of the solid organometallic compound to be increased under the condition where stable supply speed is achieved. As a result, it is possible to elongate the period during which the solid organometallic compound can be stably supplied by using the filled container of the present invention.

EXAMPLE 3

Supply stability of solid organometallic was tested by using trimethylindium as a solid organometallic compound in the filled container shown in FIGS. 29(A) to 29(C).

The supply stability test was conducted in the following manner.

Under a nitrogen atmosphere, a filled container formed of SUS and having an outer diameter of 114 mmΦ as shown in FIGS. 29(A) to 29(C) was filled with 1000 g of trimethylindium and 517 g of stainless packing material via the charging port (9). In this filling operation, for filling the filled container having the carrier gas inlet (2) with trimethylindium, the carrier gas inlet (2) was detached from the filled container at the connector (26) for using the charging port (9).

Next, the carrier gas outlet (3) was connected to a trap for trapping trimethylindium that was cooled on dry ice/methanol. Piping that connects the carrier gas outlet (3) and the trap cooled on dry ice/methanol was heated so that trimethylindium would not precipitate in this piping. The filled container filled with trimethylindium and the packing material was placed in a temperature controlled bath set at 25° C., 1000 cc per minute of nitrogen gas was introduced via the carrier gas inlet (2) of the filled container under the condition that the internal pressure of the appliance system for the supply stability test was reduced to about 66.6 kPa (500 torr), and the weight of trimethylindium trapped in the trap cooled on dry ice/methanol was measured every eight hours. Also, the gas concentration of the gas phase of carrier gas containing vapor of trimethylindium was determined by using an ultrasonic type gas densitometer ("EPISON"™ available from Thomas Swan Scientific Equipment Ltd.).

Figure 33:
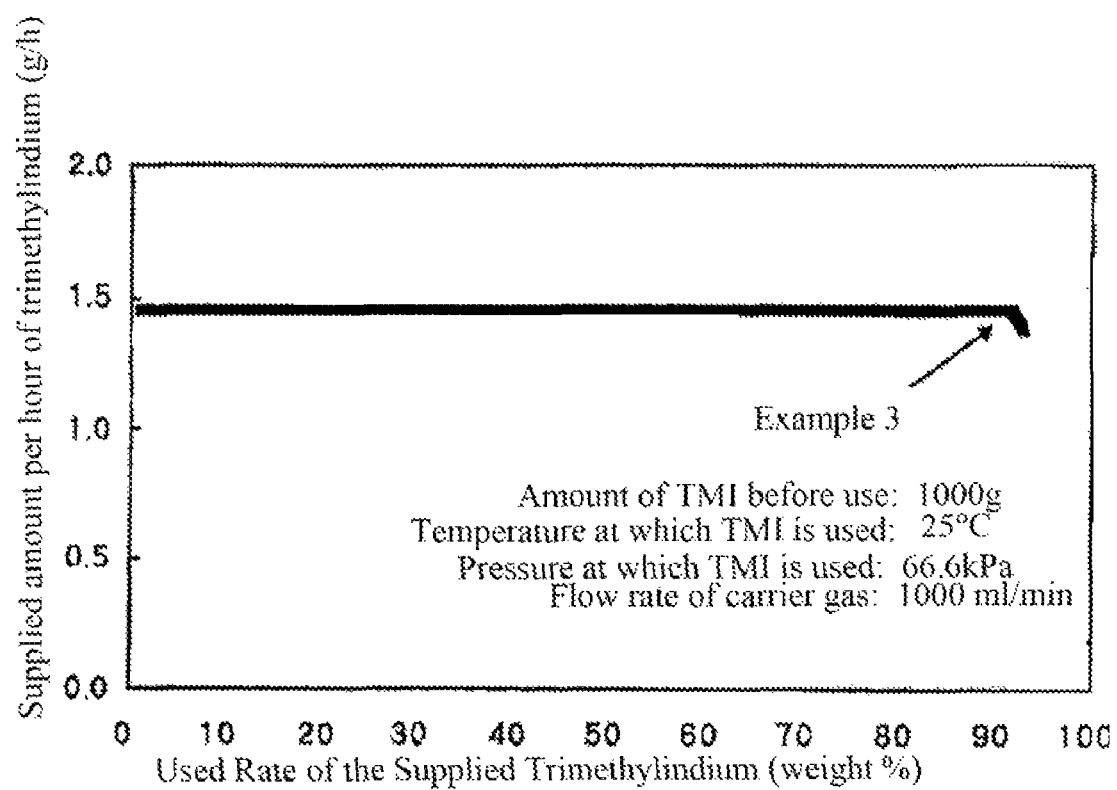
FIG. 33 is a graph representing a result of the supply stability test of trimethylindium in Example 3 (representing the relation between used rate of supplied trimethylindium and supply amount of trimethylindium per hour)

The result is shown in FIG. 33. In the graph of FIG. 33, the vertical axis represents supplied amount per hour of trimethylindium, and the horizontal axis represents used rate of the supplied trimethylindium in % by weight.

The result of the supply stability test demonstrated that when the filled container of the present invention was used, the supply speed of trimethylindium was stable up to the used rate of 92% by weight.

As demonstrated in this test, the filled container shown in FIGS. 29(A) to 29(C) makes it possible to stably supply a solid organometallic compound at a constant concentration, and enables the used rate of the solid organometallic compound to be increased under the condition where stable supply speed is achieved. As a result, it is possible to elongate the period during which the solid organometallic compound can be stably supplied by using the filled container of the present invention.

COMPARATIVE EXAMPLE 2

A conventional filled container A shown in FIG. 34 was filled with trimethylindium as a solid organometallic compound and supply stability of the solid organometallic compound was examined in the same manner as described in Example 2. The result of the supply stability test demonstrated that when the conventional filled container A shown in FIG. 34 was used, the supply speed of trimethylindium was stable up to the used rate of 52% by weight.

According to the present invention, it is possible to stably supply an apparatus for vapor phase epitaxial growth such as an MOCVD apparatus with a solid organometallic compound over a long term without increasing the outer size of the filled container compared to the conventional filled container.

What is claimed is:

1. A solid organometallic compound-filled container comprising:
   a container having an interior separated by at least one partition in a vertical direction such that said interior of said container comprises at least two vertically extending compartments;
   a carrier gas inlet and a carrier gas outlet provided for said container for the supply of carrier gas to said container and the removal of carrier gas from said container;
   said at least one partition comprises one or more partitions having an opening provided such that carrier gas can flow through said opening between respective said compartments;
   said compartments each include a compartment inlet for carrier gas and a compartment outlet for carrier gas positioned such that gas will flow vertically through said compartments from one end of each of said compartments to the other, said compartment inlet and said compartment outlet in each of said compartments comprising one of said carrier gas inlet of said container, said carrier gas outlet of said container and said opening;
   wherein, for each said compartment, said compartment inlet is positioned at one of (a) a position lower than or equal to one third of the internal height of said container from an internal bottom of said container, and (b) a position more than or equal to two thirds of the internal height of said container from said internal bottom of said container, and said compartment outlet is positioned at the other of (a) the position lower than or equal to one third of the internal height of said container from said internal bottom of said container, and (b) the position more than or equal to two thirds of the internal height of said container from said internal bottom of said container;
   organometallic compound filled in each said compartment to a point at least above the lower of said compartment inlet and said compartment outlet; and
   a charging port provided for each said compartment for filling more of said organometallic compound in a solid state into each said compartment.

2. The solid organometallic compound-filled container of claim 1, wherein said opening is positioned at one of (a) a lower part of said partition and (b) an upper part of said partition.

3. The solid organometallic compound-filled container of claim 1, wherein said solid organometallic compound is trimethylindium.

4. A solid organometallic compound-filled container comprising:
   a container having an interior separated by at least one partition in a vertical direction such that said interior of said container comprises at least two vertically extending compartments;
   a carrier gas inlet and a carrier gas outlet provided for said container for the supply of carrier gas to said container and the removal of carrier gas from said container;
   said at least one partition comprises one or more partitions having an opening provided such that carrier gas can flow through said opening between respective said compartments;
   said compartments each include a compartment inlet for carrier gas and a compartment outlet for carrier gas positioned such that gas will flow vertically through said compartments from one end of each of said compartments to the other, said compartment inlet and said compartment outlet in each of said compartments comprising one of said carrier gas inlet of said container, said carrier gas outlet of said container and said opening;
   wherein, for each said compartment, said compartment inlet is positioned at one of (a) a position lower than or equal to one third of the internal height of said container from an internal bottom of said container, and (b) a position more than or equal to two thirds of the internal height of said container from said internal bottom of said container, and said compartment outlet is positioned at the other of (a) the position lower than or equal to one third of the internal height of said container from said internal bottom of said container, and (b) the position more than or equal to two thirds of the internal height of said container from said internal bottom of said container;
   organometallic compound filled in each said compartment to a point at least above the lower of said compartment inlet and said compartment outlet; and
   a charging port provided for each said compartment for filling more of said organometallic compound in a solid state into each said compartment;
   wherein said at least one partition comprises a partition having said opening positioned such that carrier gas introduced from said carrier gas inlet flows through said solid organometallic compound of the one of said at least two vertically extending compartments, then through said opening, and then through said solid organometallic compound of the other of said at least two compartments to said carrier gas outlet.

* * * * *